(12) United States Patent
Werber et al.

(10) Patent No.: US 9,013,676 B2
(45) Date of Patent: Apr. 21, 2015

(54) INDIVIDUAL MIRROR FOR CONSTRUCTING A FACETED MIRROR, IN PARTICULAR FOR USE IN A PROJECTION EXPOSURE SYSTEM FOR MICROLITHOGRAPHY

(75) Inventors: Armin Werber, Gottenheim (DE); Norbert Muehlberger, Aalen-Ebnat (DE); Florian Bach, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 400 days.

(21) Appl. No.: 13/172,448

(22) Filed: Jun. 29, 2011

(65) Prior Publication Data

US 2011/0273694 A1  Nov. 10, 2011

Related U.S. Application Data

(63) Continuation of application No. PCT/EP2010/000044, filed on Jan. 8, 2010.

(60) Provisional application No. 61/143,456, filed on Jan. 9, 2009.

(30) Foreign Application Priority Data

Jan. 9, 2009 (DE) .......................... 10 2009 000 099

(51) Int. Cl.
*G03B 27/54* (2006.01)
*G03B 27/72* (2006.01)
(Continued)

(52) U.S. Cl.
CPC .............. *G02B 26/0841* (2013.01); *G02B 5/09* (2013.01); *G03F 7/70075* (2013.01)

(58) Field of Classification Search
USPC .............. 355/52, 53, 55, 67–71, 77; 359/849, 359/872, 877; 250/492.1, 492.2, 492.22, 250/493.1, 548

See application file for complete search history.

(56) References Cited

U.S. PATENT DOCUMENTS 4,662,746 A * 5/1987 Hornbeck ................... 359/223.1
5,444,566 A * 8/1995 Gale et al. ................... 359/291
(Continued)

FOREIGN PATENT DOCUMENTS

CN           1774675        5/2006
DE    695 29 880 T2     11/2003
(Continued)

OTHER PUBLICATIONS

J. Li et al. "Deep-Reactive Ion-Etched Compliant Starting Zone Electrostatic Zipping Actuators" Journal of Micromechanical Systems, vol. 14, No. 6, 2005.
(Continued)

*Primary Examiner* — Christina Riddle
(74) *Attorney, Agent, or Firm* — Fish & Richardson P.C.

(57) ABSTRACT

An individual mirror is used to construct a facet mirror. A mirror body of the individual mirror is configured to be tiltable relative to a rigid carrier body about at least one tilting axis of a tilting joint. The tilting joint is configured as a solid-body joint. The solid-body joint, perpendicular to the tilting axis, has a joint thickness S and, along the tilting axis, a joint length L. The following applies: L/S>50. The result is an individual mirror to construct a facet mirror, which can be reproduced and is precisely adjustable and simultaneously ensures adequate heat removal, in particular, heat produced by residually absorbed useful radiation, which is reflected by the individual mirror, by dissipation of the heat by the mirror body.

24 Claims, 15 Drawing Sheets

(51) Int. Cl.
*G02B 26/08* (2006.01)
*G02B 5/09* (2006.01)
*G03F 7/20* (2006.01)
*G03B 27/68* (2006.01)
*G03B 27/52* (2006.01)
*G03B 27/32* (2006.01)

(56) References Cited

U.S. PATENT DOCUMENTS

| | | | |
|---|---|---|---|
| 5,523,193 A * | 6/1996 | Nelson | 430/311 |
| 5,552,924 A * | 9/1996 | Tregilgas | 359/224.1 |
| 5,835,256 A | 11/1998 | Huibers | |
| 6,028,689 A * | 2/2000 | Michalicek et al. | 359/224.1 |
| 6,300,665 B1 * | 10/2001 | Peeters et al. | 257/415 |
| 6,366,414 B1 | 4/2002 | Aksyuk et al. | |
| 6,438,199 B1 * | 8/2002 | Schultz et al. | 378/34 |
| 6,658,084 B2 | 12/2003 | Singer | |
| 6,757,093 B2 * | 6/2004 | Wood et al. | 359/291 |
| 6,859,515 B2 | 2/2005 | Schultz et al. | |
| 7,002,730 B2 | 2/2006 | Ishizuya et al. | |
| 7,015,489 B2 | 3/2006 | Singer et al. | |
| 7,015,491 B2 * | 3/2006 | Eurlings et al. | 250/548 |
| 2002/0131679 A1 * | 9/2002 | Nasiri | 385/18 |
| 2003/0227700 A1 | 12/2003 | Mizuno et al. | |
| 2004/0114259 A1 * | 6/2004 | Ishizuya et al. | 359/849 |
| 2004/0160118 A1 * | 8/2004 | Knollenberg et al. | 303/113.1 |
| 2004/0165250 A1 | 8/2004 | Aubuchon | |
| 2005/0030653 A1 * | 2/2005 | Holderer et al. | 359/872 |
| 2005/0219497 A1 * | 10/2005 | Bleeker | 355/69 |
| 2006/0132747 A1 | 6/2006 | Singer et al. | |
| 2007/0081225 A1 | 4/2007 | Aubuchon | |
| 2008/0144155 A1 | 6/2008 | Pan | |
| 2008/0158442 A1 * | 7/2008 | Arai et al. | 348/771 |
| 2008/0278704 A1 | 11/2008 | Endres et al. | |
| 2011/0001947 A1 * | 1/2011 | Dinger et al. | 355/67 |

FOREIGN PATENT DOCUMENTS

| | | |
|---|---|---|
| DE | 103 43 333 A | 4/2005 |
| DE | 10 2006 036 064 A1 | 2/2008 |
| EP | 1 225 481 | 7/2002 |
| EP | 1 289 273 A1 | 3/2003 |
| JP | 2004-013099 A | 1/2004 |
| JP | 2004-306217 | 11/2004 |
| JP | 2006-018176 A | 1/2006 |
| JP | 2006-518882 A | 8/2006 |
| JP | 2006-523944 A | 10/2006 |
| JP | 2008-152238 A | 7/2008 |
| WO | WO 2007/128407 | 11/2007 |

OTHER PUBLICATIONS

Yeow et al., Sensors and Actuators A 117 (2005), 331-340.
Istvan Reimann, "Parkette, geometrisch betrachtet" (*A geometric view of tilings*), in "Mathematisches Mosaik" (*Mathematical Mosaic*), Cologne (1977). (English translation).
German Examination Report, with English translation, for corresponding DE Appl No. 10 2009 000 099.2, dated Dec. 3, 2009.
English translation and Chinese Office Action, for Chinese Application No. 201080004210.8, dated Nov. 26, 2012.
M.A. Rosa et al "A novel external electrode configuration for the elastrostatic actuation of MEMS based devices", J. Micromech. Microeng., vol. 14, No. 1, Apr. 1, 2004.
The International Search Report for corresponding Application No. PCT/EP2010/000044, dated Apr. 27, 2010.
Japanese office action, with English translation thereof, for corresponding JP Appl No. 2011-544842, dated Dec. 24, 2013.

* cited by examiner

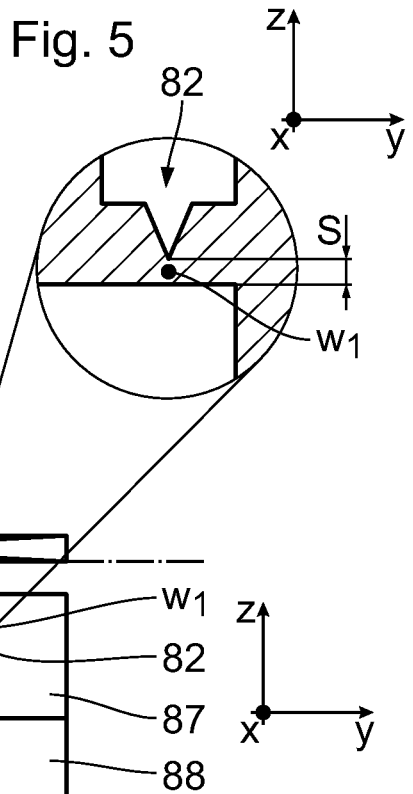
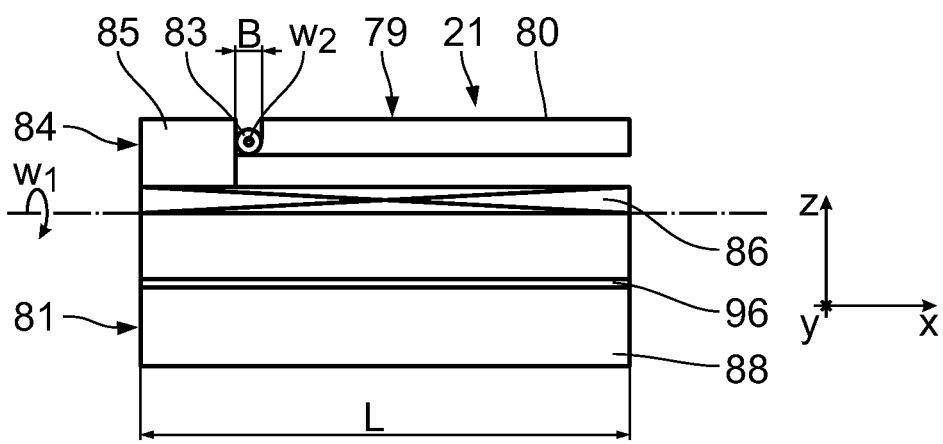

INDIVIDUAL MIRROR FOR CONSTRUCTING A FACETED MIRROR, IN PARTICULAR FOR USE IN A PROJECTION EXPOSURE SYSTEM FOR MICROLITHOGRAPHY

CROSS-REFERENCE TO RELATED APPLICATIONS

This application is a continuation of, and claims priority under 35 USC 120 to, international application PCT/EP2010/000044, filed Jan. 8, 2010. International application PCT/EP2010/00004 claims benefit of German Application No. 10 2009 000 099.2, filed Jan. 9, 2002 and international application PCT/EP2010/000044 claims priority under 35 USC 119 (e) of U.S. Ser. No. 61/143,456, filed Jan. 9, 2009. International application PCT/EP2010/000044 is hereby incorporated by reference in its entirety.

FIELD

The disclosure relates to an individual mirror for constructing a facet mirror, in particular for use as a bundle-guiding optical component in a projection exposure system for microlithography.

BACKGROUND

Facet mirrors constructed from individual mirrors are known from U.S. Pat. No. 6,438,199 B1 and U.S. Pat. No. 6,658,084 B2.

SUMMARY

The present disclosure provides an individual mirror for constructing a facet mirror, which, with a compact arrangement for tilting a reflection face of the individual mirror, ensures adequately high adjusting forces.

It was recognised that an individual mirror with the actuator according to the disclosure with a compact arrangement allows the production of adjusting forces in the mN-range, which, with a typical microconfiguration of the solid-body joint, are sufficient to produce a desired tilting of the individual mirror. Corresponding actuators are also known as zipping actuators (moving wedge actuators or rolling closure actuators) and described for example in the specialist article by J. Li et al. "Deep-Reactive Ion-Etched Compliant Starting Zone Electrostatic Zipping Actuators" Journal of Micromechanical Systems, VOL. 14, NO. 6, 2005 and the specialist article by M. A. Rosa et al. "A novel external electrode configuration for the elastrostatic actuation of MEMS based devices", J. Micromech. Microeng., 14, 2004.

Three or four actuators, each with a movement electrode, can be advantageous to ensure an adequately high number of degrees of freedom of movement. The edge form of the reflection face may be adapted to the number of movement electrodes. If three movement electrodes are used, the reflection face of the individual mirror may, for example, be triangular. An edge form of the individual mirror is preferred, with which a gapless tiling of a total reflection face of a facet mirror with identically edged individual mirrors can be provided.

A curved movement electrode can provide the possibility of continuously increasing the contact face portion when applying a voltage between the movement electrode and the counter-electrode, the spacing between the movement electrode and the counter-electrode in the spacing face portion being reduced, so a high electrical field strength with a correspondingly large adjusting force results there.

Rectangular base face designs or spiral base face designs of a movement electrode can be particularly suitable for providing compact adjusting arrangements. A spiral design is particularly compact here.

A progressively increasing electrode spacing in the spacing face portion can provide the possibility of a respective self-reinforcing force development with increasingly applied electrical voltage between the electrodes.

Certain voltage inputs, even in a neutral position, allow a precisely defined positioning of the mirror body with respect to the carrier body to be brought about. The neutral position is not then predetermined by the force-free state of the at least one solid-body joint.

The disclosure also provides an individual mirror to construct a facet mirror, which can be reproduced and precisely adjusted, and simultaneously ensures adequate heat removal, in particular produced by residually absorbed useful radiation, which is reflected by the individual mirror, by dissipating the heat by the mirror body.

The size ratio of the joint length to the joint thickness, with given low rigidity, in particular to achieve an adjusting displacement with low force outlay, ensures that adequate heat dissipation from the mirror body to the carrier body is ensured by the solid-body joint. The joint length, which is great in contrast to the joint thickness, in this case ensures an adequately large heat transmission cross section through the solid-body joint. Owing to the joint thickness, which is small in relation to the joint length, a given angle deflection of the mirror body is possible with a low force outlay to adjust the individual mirror. This provides the possibility of using an actuator system for tilting the mirror body, which manages with low forces and therefore can be very compact in design, for example. The actuators which can be used to tilt the mirror body, in particular, are those which are used in the construction of conventional micromirror arrays. Micromirror arrangements of this type are known to the person skilled in the art under the keyword "MEMS" (microelectromechanical systems) for example from EP 1 289 273 A1. In comparison to known torsion suspensions of micro mirrors (cf. Yeow et al., Sensors and Actuators A 117 (2005), 331-340) with a very much smaller length/thickness ratio, the heat transfer when using the solid-body joints according to the disclosure is significantly improved. This is advantageous, in particular, if heat has to be dissipated because of significant residual absorption by the mirror body, as is the case, for example, when using EUV radiation as useful radiation reflected by the individual mirror. In addition, the heat transfer between the mirror body and the carrier body can be further improved, for example, by using microchannels in the carrier body, which allow active cooling with an, in particular, laminarly through-flowing cooling liquid.

Two tilting joints can allow a variable adjustment of a deflection angle for useful radiation impinging on the mirror body.

A functional separation of the individual mirror bodies involved can allow a structurally simple design thereof.

A configuration with two solid-body joints can allow good heat transfer via the two solid-body joints. In particular, good heat transfer is possible from the mirror body via the intermediate body to the carrier body.

Separate solid-body joint portions can lead to a reduction in the flexural rigidity of the solid-body joint.

An, in particular, capacitively acting electrode actuator can be produced compactly and with microprocessing techniques. At a given heat transfer, a solid-body joint which is flexurally rigid to such a small extent can be realised via the ratio according to the disclosure of the joint length and joint thickness, in such a way that typical forces, which can be produced by an electrode actuator of this type and are, for example, in the mN-range, are sufficient to produce the desired tilting angle.

A force-free space of the electrode, on the one hand, can lead to the production of high field strengths and, on the other hand, is adequate to produce the generally desired small tilting angles.

An actuator with an electrode stack can lead to the possibility of producing in total high adjusting forces at a given absolute voltage difference between adjacent electrodes.

The advantages of the actuator of an individual mirror can correspond to those which have already been discussed above. This actuator can be developed in such a way as has already been discussed above.

A reflection face can be suitable for the configuration of the facet mirror according to the disclosure. Optionally, the mirror face may also be smaller and, for example, have a dimension which spans the mirror face and is in the range of a few tenths of millimeters. Larger mirror faces such as 1 mm$^2$ are also possible. The reflection face may have a rectangular, hexagonal or else a triangular edge form. Other polygonal edge shapings, for example pentagonal, are also possible.

A tilting axis course can allow a precise adjustment of the useful radiation. If the tilting axis is located in the plane of the mirror face, a tilting of the individual mirror does not lead to an offset of the emergent useful radiation or at most to a very small offset.

A side arrangement of the tilting joint can allow a compact structure with regard to the overall depth.

Certain tilting joint arrangements can avoid dead areas on the plane of the reflection face of the mirror body. Reflection faces of adjacent individual mirrors can then be arranged close-packed and practically without an intermediate space.

Electrodes arranged separately from one another can allow an adjustment of the mirror body relative to the carrier body with several degrees of freedom.

A quadrant-wise arrangement of four electrodes can simplify the activation outlay for an electrode actuator system of the individual mirror for specifying, for example, changes running in a targeted linear manner to a deflection of the incident useful radiation by the individual mirror.

The advantages of a facet mirror can correspond to those which have already been described above in conjunction with the individual mirror according to the disclosure. The facet mirror may have precisely one individual mirror according to the disclosure. The facet mirror may have a plurality of individual mirrors according to the disclosure.

The facet mirror may have more than 50, more than 100, more than 200, more than 500 or else more than 1000 individual mirrors according to the disclosure.

When using certain facet mirrors, a variability in the adjustment of various illumination geometries of an object field to be exposed is increased when using the facet mirror in a projection exposure system.

The sub-division of the facet mirror into a large number of individual mirrors, which can be tilted independently of one another, allows a variable specification of sub-divisions of the facet mirror into individual mirror groups. This can be used to produce groupings with various edges, to thus, for example, ensure an adaptation to the shape of an object field to be illuminated. The individual activatability of the individual mirror ensures that a large number of different illuminations of the object field is possible without thus losing light through shadings. In particular, an adaptation of an illumination optical system, within which the facet mirror can be used, to optical parameters of a radiation source is possible, for example to a beam divergence or an intensity distribution over the beam cross section. The facet mirror can be configured in such a way that a plurality of individual mirror groups in each case per se illuminates the total object field. More than 10, more than 50 or else more than 100 individual mirror groups of this type may be provided in the facet mirror according to the disclosure. An individual mirror illumination channel is that part of the beam path of a bundle of the illumination radiation guided by the facet mirror which is guided by precisely one of the individual mirrors of the facet mirror. According to the disclosure, at least two individual mirror illumination channels of this type are used to illuminate the whole object field. In the facet mirrors according to U.S. Pat. No. 6,438,199 B1 and U.S. Pat. No. 6,658,084 B2, the individual mirror illumination channels each illuminate object field portions, the size of which corresponds to the object field.

The advantages of an illumination optical system can correspond to those which have already been listed above with reference to the facet mirror according to the disclosure.

Both a field facet mirror sub-divided according to the disclosure into individual mirrors and a pupil facet mirror sub-divided according to the disclosure into individual mirrors can preferably be used within the illumination optical system. A specific illumination angle distribution, in other wards an illumination setting, can then be realised practically without loss of light by a corresponding grouping of the individual mirror groups on the field facet mirror and the pupil facet mirrors. According to the disclosure, a specular reflector in the manner of that which is described, for example, in US 2006/0132747 A1, can also be sub-divided into individual mirrors. As both the intensity and the illumination angle distribution in the object field is adjusted with the specular reflector, the addition variability because of the sub-division into individual mirrors comes to the fore particularly well here.

An illumination optical system may, for example, combine the advantages of a field facet mirror constructed from individual mirrors with those of a pupil facet mirror constructed from individual mirrors. The adjustment of the most varied illumination settings is possible practically without loss of light. The pupil facet mirror may have a larger number of individual mirrors than the field facet mirror located upstream. With the field facet mirror located upstream, various illumination forms of the pupil facet mirror and therefore various illumination settings of the illumination optical system can then be realised, if the facets can be correspondingly displaced by an actuator, in particular tilted, for adjustment.

The advantages of a projection exposure system can correspond to those which have already been discussed above.

A projection exposure system can allow for high structural resolution.

The advantages of a production method and a microstructured component can correspond to those which have already been described above. Microstructured components with high integration densities through to the sub-micrometer range can be realised.

BRIEF DESCRIPTION OF THE DRAWINGS

Embodiments of the disclosure will be described in more detail below with the aid of the drawings, in which:

FIG. 4 shows a view of the individual mirror from the viewing direction IV in FIG. 3, a reflection face of the individual mirror being shown in an untilted neutral position;

FIG. 5 shows a detail enlargement from FIG. 4;

FIG. 6 shows a view of the individual mirror from the viewing direction VI in FIG. 3;

DETAILED DESCRIPTION

Figure 1:
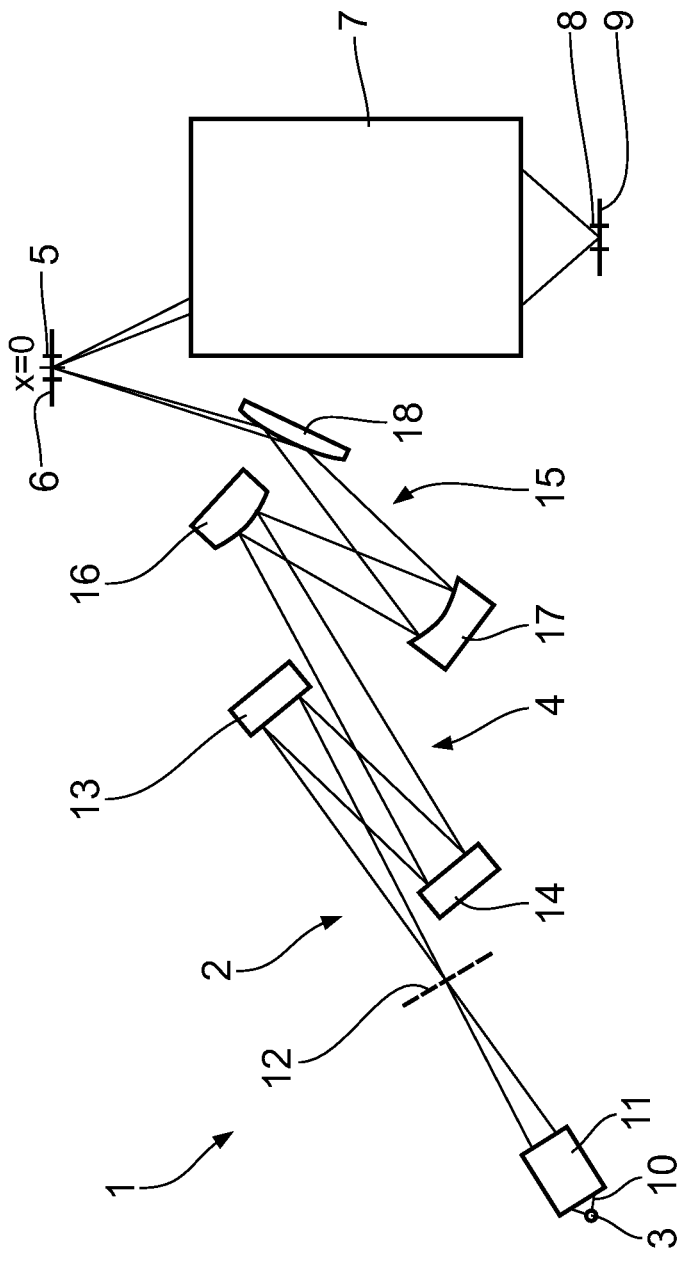
FIG. 1 schematically shows a meridional section through a projection exposure system for EUV projection lithography.

FIG. 1 schematically shows, in a meridional section, a projection exposure system 1 for microlithography. An illumination system 2 of the projection exposure system 1, apart from a radiation source 3, has an illumination optical system 4 for exposing an object field 5 in an object plane 6. A reticle, not shown in the drawing and arranged in the object field 5 is exposed here, and is held by a reticle holder, also not shown. A projection optical system 7 is used to image the object field 5 in an image field 8 in an image plane 9. The structure on the reticle is imaged on a light-sensitive layer of a wafer, which is arranged in the region of the image field 8 in the image plane 9 and which is also not shown in the drawing and is held by a wafer holder, also not shown.

The radiation source 3 is a EUV radiation source with an emitted useful radiation in the range between 5 nm and 30 nm. This may be a plasma source, for example a GDPP source (Gas Discharge-Produced Plasma) or an LPP source (Laser-Produced Plasma). A radiation source, which is based on a synchrotron, can also be used for the radiation source 3. Information with regard to a radiation source of this type can be found by the person skilled in the art, for example, from U.S. Pat. No. 6,859,515 B2. EUV radiation 10, which is emitted by the radiation source 3, is bundled by a collector 11. A corresponding collector is known from EP 1 225 481 A. After the collector 11, the EUV radiation 10 propagates through an intermediate focus plane 12, before it impinges on a field facet mirror 13. The field facet mirror 13 is arranged in a plane of the illumination optical system 4, which is optically conjugated to the object plane 6.

The EUV radiation 10 is also called illumination light or imaging light below.

After the field facet mirror 13, the EUV radiation 10 is reflected by a pupil facet mirror 14. The pupil facet mirror 14 is arranged in a pupil plane of the illumination optical system 4, which is optically conjugated to a pupil plane of the projection optical system 7. With the aid of the pupil facet mirror 14 and an imaging optical assembly in the form of a transmission optical system 15 with mirrors 16, 17 and 18 designated in the order of the beam path, field individual facets, which will be described in more detail below and which are also called sub-fields or individual mirror groups, of the field facet mirror 13 are imaged in the object field 5. The last mirror 18 of the transmission optical system 15 is a grazing incidence mirror.

Figure 2:
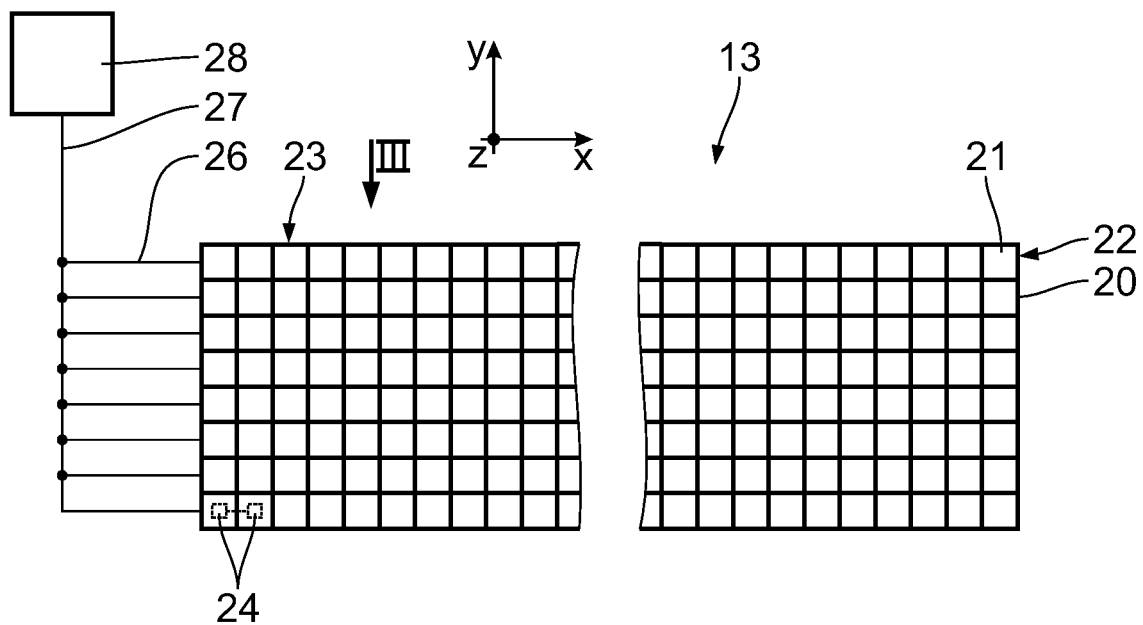
FIG. 2 schematically shows a plan view of a field facet mirror constructed from individual mirrors for use in the projection exposure system according to FIG. 1.

FIG. 2 shows details of the construction of the field facet mirror 13 in a highly schematic view. A total reflection face 20 of the field facet mirror 13 is divided line-wise and column-wise into a raster of individual mirrors 21. The individual reflection faces of the individual mirrors 21 are planar. An individual mirror line 22 has a plurality of individual mirrors 21 arranged directly next to one another. Several tens to several hundreds of individual mirrors 21 may be provided in an individual mirror line 22. In the example according to FIG. 2, the individual mirrors 21 are square. Other forms of individual mirrors, which allow the reflection face 20 to be occupied without gaps as far as possible, can be used. Alternative individual mirror forms of this type are known from the mathematical theory of tiling. In this context reference is made to Istvan Reimann: "Parkette, geometrisch betrachtet", in "Mathematisches Mosaik", Cologne (1977), and Jan Gulberg: "Mathematics—From the birth of numbers", New York/London (1997).

The filed facet mirror 13 may, for example, be configured as described in DE 10 2006 036 064 A1.

An individual mirror column 23, depending on the configuration of the field facet mirror 13, also has a plurality of individual mirrors 21. Per individual mirror column 23, some tens of individual mirrors 21 are provided, for example.

To facilitate the description of positional relationships, a Cartesian xyz coordinates system is drawn in FIG. 2 as a local coordinates system of the field facet mirror 13. Corresponding local xyz coordinates systems are also found in the following figures, which show facet mirrors or a detail thereof in plan view. In FIG. 2, the x-axis runs horizontally to the right parallel to the individual mirror lines 22. The y-axis in FIG. 2 runs upwardly parallel to the individual columns 23. The z-axis is perpendicular to the plane of the drawing of FIG. 2 and runs out of it.

During the projection exposure, the reticle holder and the wafer holder are scanned synchronously with respect to one another in the y-direction. A small angle between the scanning direction and the y-direction is also possible, as will be explained.

In the x-direction, the reflection face 20 of the field facet mirror 13 has an extent of $x_0$. In the y-direction, the reflection face 20 of the field facet mirror 13 has an extent of $y_0$.

Depending on the configuration of the field facet mirror 13, the individual mirrors 21 have x/y-extents in the region, for example, of 600 µm×600 µm to, for example, 2 mm×2 mm. The entire field facet mirror 13 has an $x_0/y_0$-extent, which, depending on the configuration is 300 mm×300 mm or 600 mm×600 mm, for example. The field individual facets have typical x/y-extents of 25 mm×4 mm or of 104 mm×8 mm. Depending on the ratio between the size of the respective field individual facets and the size of the individual mirrors 21, which build up these field individual facets, each of the field individual facets has a corresponding number of individual mirrors 21.

Figure 3:
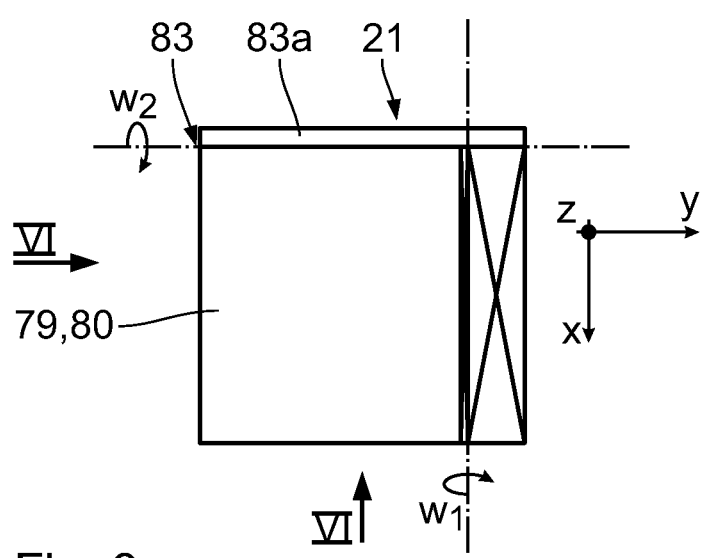
FIG. 3 shows a plan view of an individual mirror for constructing the field facet mirror according to FIG. 2.

Each of the individual mirrors 21 is in each case connected to an actuator 24 for the individual deflection of impinging illumination light 10, as shown by dashed lines in FIG. 2 with the aid of two individual mirrors 21 arranged in a corner at the bottom left of the reflection face 20 and shown in more detail in FIG. 3 with the aid of a detail of an individual facet line 22. The actuators 24 are arranged on the side of each of the individual mirrors 21 remote from a reflective side of the individual mirrors 21. The actuators 24 may, for example, be configured as piezo actuators. Configurations of actuators of this type are known from the structure of micromirror arrays.

The actuators 24 of an individual mirror line 22 are in each case connected by signal lines to a line signal bus 26. One individual mirror line 22 is allocated in each case to one of the line signal buses 26. The line signal buses 26 of the individual mirror lines 22 are in turn connected to a main signal bus 27. The latter has a signal connection to a control device 28 of the field facet mirror 13. The control device 28 is configured, in particular, for row-wise, in other words line-wise or column-wise, joint activation of the individual mirrors 21.

Each of the individual mirrors 21 can be tilted individually independently about two tilting axes, which are perpendicular to one another, a first of these tilting axes extending parallel to the x-axis and the second of these two tilting axes extending parallel to the y-axis. The two tilting axes are located in the individual reflection faces of the respective individual mirrors 21.

The individual mirrors 21 may, for example, be realised in the manner of a micromirror array (MMA array), in which the individual mirrors are moveably mounted by spring joints attached at the side and can be electrostatically actuated. Micromirror arrangements of this type are known to the person skilled in the art under the keyword "MEMS" (microelectromechanical systems) for example from EP 1 289 273 A1.

In the embodiments described above, the individual mirrors 21 provide illumination channels for superimposing the EUV radiation 10, in other words the illumination radiation, in the object field 5 of the projection exposure system 1. The individual mirrors 21 have mirror faces with an extent such that these individual mirror illumination channels in the object field 5 illuminate object portions, which are smaller than the object field 5.

The individual mirrors 21 may have a multi-layer coating with individual layers of molybdenum and silicon, so the reflectivity of the individual mirrors 21 is optimised for the EUV wavelength used.

An embodiment of an individual mirror, for example one of the individual mirrors 21 for constructing the field facet mirror 13 according to FIG. 2 will be described below in more detail with the aid of FIGS. 3 to 7. Components which correspond to those which have already been described above with reference to FIGS. 1 to 2 have the same reference numerals and will not be discussed again in detail.

The individual mirror 21 according to FIGS. 3 to 7 has a mirror body 79 configured as a mirror plate. The mirror body 79 is made of silicon. The mirror body 79 has a rectangular reflection face 80 and, in the configuration according to FIGS. 3 to 7, an approximately square reflection face 80 to reflect the EUV radiation 10. The reflection face 80 may have a multi-layer reflection coating to optimise the reflectivity of the individual mirror 21 for the EUV radiation 10.

The mirror body 79 of the individual mirror 21 can be tilted relative to a rigid carrier body 81 made of silicon about two tilting axes. These two tilting axes are designated $w_1$ and $w_2$ in FIGS. 3 to 7. Each of these two tilting axes $w_1$, $w_2$ belongs to a tilting joint 82, 83, which is in each case configured as a solid-body joint. The two tilting axes $w_1$, $w_2$ are perpendicular to one another. The tilting axis $w_1$ in this case runs parallel to the x-axis and the tilting axis $w_2$ runs parallel to the y-axis. The mirror body 79 and the carrier body 81 may also be configured of $FiO_2$ or of $Fi_3N_4$. The tilting axis $w_2$ in this case runs in the extension plane of the mirror body 79. Apart from the actual reflection face 80 of the mirror body 79, a small, non-tiltable dead area 83a remains, which is shown in FIG. 3 above the tilting axis $w_2$. The two tilting axes $w_1$, $w_2$ both run parallel to the plane of the reflection face 80. Alternatively, it is also possible for the tilting joints 82, 83 to be arranged in such a way that at least one of the two tilting axes $w_1$, $w_2$ runs in the plane of the reflection face 80.

Further material examples of EUV-compatible and high-vacuum-compatible materials, which are suitable for constructing the individual mirror 21, are CVD (Chemical Vapour Deposition) diamond, SiC (silicon carbide), $SiO_2$ (silicon oxide), $Al_2O_3$, copper, nickel, aluminium alloys and molybdenum.

FIG. 5 shows the tilting joint 82 belonging to the tilting axis $w_1$ in an enlarged view. The tilting joint 83 is configured correspondingly.

The tilting joint 82, perpendicular to the tilting axis $w_1$, in other words in the z-direction in FIG. 5, has a joint thickness S. Along the tilting axis $w_1$, in other words in the x-direction in FIG. 5, the tilting joint 82 has a joint length L (cf FIG. 6). The joint length L is comparable in size with a transverse extent of the mirror body 79.

The joint length L in the individual mirror 21, according to FIGS. 3 to 7, is about 1 mm.

The joint thickness S, which is shown in an exaggerated manner in the drawing, is 1 µm. The quotient L/S is therefore about 1000 in the individual mirror 21 according to FIGS. 30 to 34.

A material tapering, which leads to a joint thickness S of the solid-body tilting joint 82 and is shown by way of example in FIG. 5 as a V-shaped notch, can be produced, for example, by anisotropic AOH (sic) etching. Alternatively it is possible to bring a material arm of the tilting joint 82 as a whole, for example by an etching process, to a size corresponding to the joint thickness S.

The mirror body 79 is connected in one piece to an intermediate carrier body 84 via the tilting joint 83, the dimensions of which, in particular the joint thickness S and the joint length L thereof, correspond to those of the tilting joint 82. The intermediate carrier body 84 is also made of silicon. The intermediate carrier body 84 is L-shaped in the cross section of FIG. 6 and has a joint portion 85, which is arranged directly adjacent to the tilting joint 83, and a plate portion 86 arranged under the mirror body 79, in other words on the side of the mirror body 79 remote from the reflection face 80. A spacing B (cf. FIG. 6), which is also called the width of the tilting joint 83, is present in the region of the tilting joint 83 between the mirror body 79 and the joint portion 85 of the intermediate carrier body 84.

The plate portion 86 of the intermediate carrier body 84 is connected in one piece via the tilting joint 82 to a joint portion 87 of the carrier body 81. The joint portion 87 is fixed to a plate portion 88 of the carrier body 81. The plate portion 88 of the carrier body 81 is arranged below the plate portion 86 of the intermediate carrier body 84. In the neutral position shown in FIGS. 4 and 6, the mirror body 79, the plate portion 86 of the intermediate carrier body 84 as well as the plate portion 88 of the carrier body 81 run parallel to one another.

Figure 7:
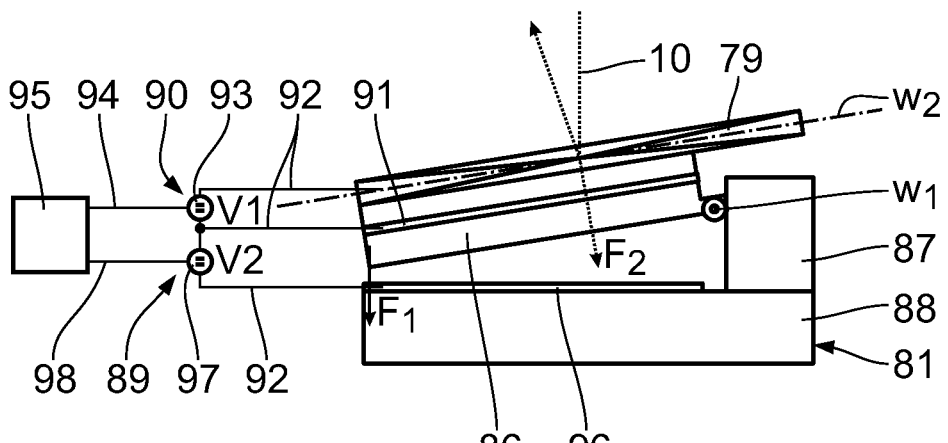
FIG. 7 shows the individual mirror in a tilting position tilted by an actuator in a view similar to FIG. 4.

For the controlled tilting of the mirror body 79 about the two tilting axes $w_1$, $w_2$, two electrode actuators 89, 90 are used (cf. FIG. 7). The electrode actuator 89 is in this case allocated to the tilting joint 82, so it is also called the $w_1$ actuator 90. The electrode actuator 90 is in this case allocated to the tilting joint 83, so it is also called the $w_2$ actuator. The $w_2$ actuator, as the first electrode, has the mirror body 79 itself, which is electrically conductive. A counter-electrode 91 of the $w_2$ actuator 90 is configured as a conductive coating applied to the plate portion 86 of the intermediate carrier body 84, said coating facing the mirror body 79. In the neutral position of the individual mirror 21, the counter-electrode 91 has a spacing from the mirror body 79 of about 100 µm.

The two electrodes 90, 91 of the $w_2$ actuator 90 are connected to an activatable voltage source 93 by signal lines 92. The voltage source 93 is connected to an actuator control device 95 by a control line 94.

The counter-electrode 91 is simultaneously used as an electrode for the $w_1$ actuator 89. A counter-electrode 96 of the $w_1$ actuator 89 is configured as a conductive coating on the plate portion 88 of the carrier body 81. The counter-electrode 96 of the $w_1$ actuator 89 is arranged on the side of the plate portion 88 of the carrier body 81 facing the plate portion 86 of the intermediate carrier body 84. In the neutral position, in other words in the force-free state, the spacing of the counter-electrode 96 of the $w_1$ actuator 89 from the plate portion 86 of the intermediate carrier body 84 is 100 µm.

The electrodes 91, 96 are electrically connected by signal lies 92 to a further voltage source 97. The voltage source 97 is connected by a further control line 98 to the actuator control device 95.

By applying direct voltages V1 and V2 (cf. FIG. 7), on the one hand, the plate portion 86 of the intermediate carrier body 84 can be tilted in a controlled manner with respect to the plate portion 88 of the carrier body 81 about the tilting axis $w_1$ and, on the other hand, the mirror body 79 can be tilted in a controlled manner relative to the plate portion 86 of the intermediate carrier body 84 about the tilting axis $w_2$, in each case about a predetermined tilting angle. The amount of the tilting angle about the respective tilting axis $w_1$, $w_2$ depends here inter alia on the dimensioning of the tilting joints 82, 83, on the area of the electrodes 90, 91, 96, on their spacing from one another and, of course, on the size of the applied voltages V1, V2. A stepless tilting angle specification about the two tilting axes $w_1$, $w_2$ is possible via the applied voltages V1, V2.

FIG. 7 shows a tilting position, in which by applying the voltages V1, V2, a tilting, on the one hand, of the plate portion 86 of the intermediate carrier body 84 relative to the plate portion 88 of the carrier body 81 toward the latter about the tilting axis $w_1$ and, on the other hand, a tilting of the mirror body 79 relative to the plate portion 86 of the intermediate carrier body 84 and toward the latter about the tilting axis $w_2$ have taken place. Incident EUV radiation 10 is deflected in a correspondingly defined manner by the reflection face 80 of the mirror body 79, as indicated in FIG. 7.

With the aid of FIGS. 8 and 9, a further embodiment of an individual mirror 99 will be described below, which can be used instead of the individual mirror 21 according to FIGS. 3 to 7 to construct a facet mirror described as above. Components, which correspond to those which have already been described above with reference to FIGS. 1 to 2 and, in particular with reference to FIGS. 3 to 7, have the same reference numerals and will not be discussed again in detail.

Figure 8:
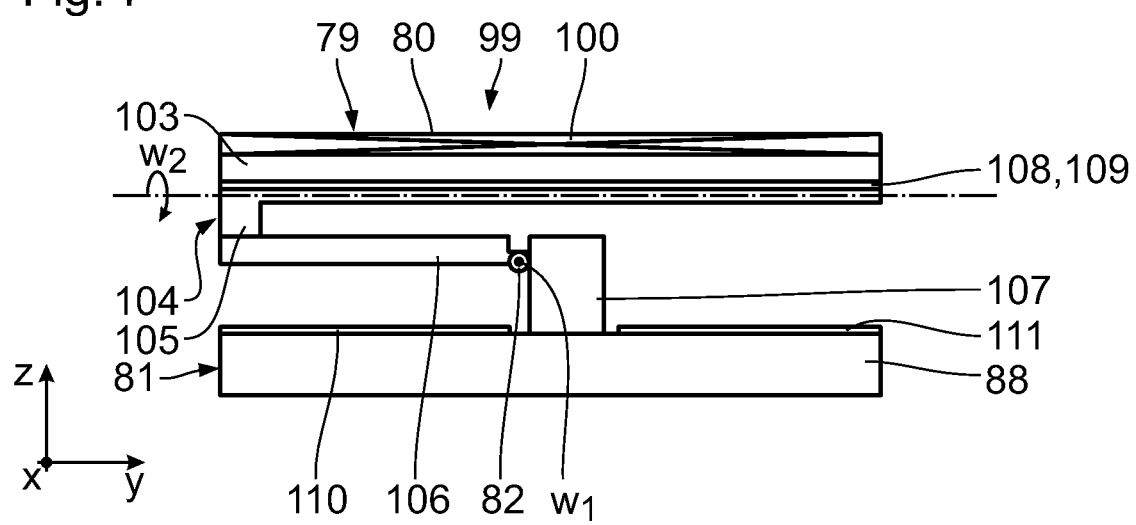
FIG. 8 shows a further configuration of an individual mirror in a view similar to FIG. 4.
Figure 9:
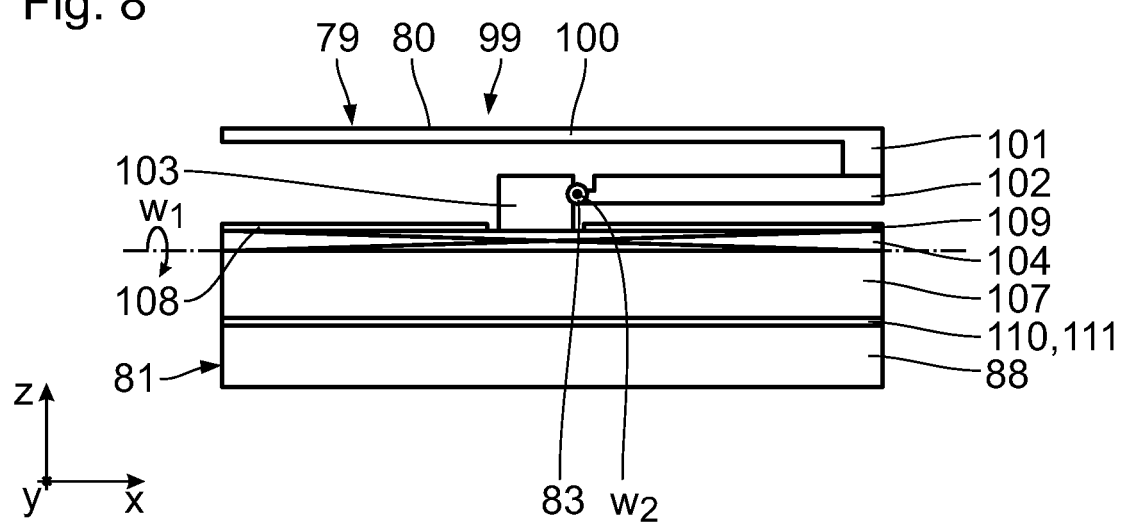
FIG. 9 shows the individual mirror according to FIG. 8 in a view similar to FIG. 6.

In the configuration according to FIGS. 8 and 9, the useful reflection face 80 of the individual mirror 99 covers the entire surface of the mirror body 79 without a dead area. A plate-shaped reflection face carrier 100 is rigidly connected to a joint portion 102 of the mirror body 79 via a connecting strip 101 extending at the edge along the y-direction. The joint portion 102 is also plate-shaped and takes up approximately half the area of the reflection face 80 of the individual mirror 99. The joint portion 102 extends parallel to the reflection face carrier 100 and behind the reflection face 80. The joint portion 102 of the mirror body 79 is connected by the $w_2$ tilting joint 83 to a $w_2$ joint portion 103 of an intermediate carrier body 104 of the individual mirror 99. The intermediate carrier body 104 corresponds to the intermediate carrier body 84 of the individual mirror 21 according to FIGS. 3 to 7, with respect to its function.

The tilting joint 83 of the individual mirror 99 also extends along the total width of the reflection face 80, in other words along the joint length L in accordance with the configuration according to FIGS. 3 to 7. This also likewise applies to the tilting joint 82 of the individual mirror 99.

The $w_2$ joint portion 103 is rigidly connected to an in turn plate-shaped $w_1$ joint portion 106 of the intermediate carrier body 104 by a connecting strip 105. The joint portion 106 again takes up approximately half the area of the reflection face 80 of the individual mirror 99. The rectangular shape of the joint portion 106 is oriented, in this case, rotated through 90° with respect to the rectangular shape of the joint portion 102. The $w_1$ joint portion 106 is connected in one piece by the tilting joint 82 to a joint portion 107 of the carrier body 81.

The joint portions 102, 103, on the one hand, and 106, 107, on the other hand, in each case extend over the entire joint length L of the tilting joints 83, 82.

The mirror body 79 and, furthermore, two counter-electrodes 108, 109, which are arranged on the plate portion 88 of the intermediate carrier body 104 as two coatings electrically insulated from one another and separated from one another by the joint portion 103 in turn belong as the electrode to the $w_2$ actuator of the tilting joint 83. The two counter-electrodes 108, 109 in each case cover approximately one half of the plate portion 88 of the intermediate carrier body 104.

By applying a tilting voltage between the electrodes 79, 108, the reflection face can be tilted about the tilting axis $w_2$ in FIG. 9 in the anti-clockwise direction. By applying a tilting voltage between the electrodes 79, 109, the mirror body 79 in FIG. 9 can be tilted in the clockwise direction.

For the $w_1$ actuator, counter-electrodes 110, 111 are used as the counter-electrodes for the electrodes 108, 109. The counter-electrodes 110, 111 are applied, comparably to the electrodes 108, 109, as coatings on the plate portion 88 of the carrier body 81 and separated from one another by the joint portion 107 and therefore electrically insulated. By applying a tilting voltage between the electrodes 108, 109, on the one hand, and the counter-electrode 110 on the other hand, a controlled tilting of the intermediate carrier body 104 tales place in FIG. 8 about the tilting axis $w_1$ in the anti-clockwise direction. By applying a tilting voltage between the electrodes 108 or 109, on the one hand, and the counter-electrode 111, on the other hand, a tilting of the intermediate carrier body 104 takes place in FIG. 8 about the tilting axis $w_1$ in the clockwise direction.

In this manner, a voltage-controlled tilting of the reflection face 80 of the individual mirror 99, proceeding from the neutral position shown in FIGS. 8 and 9 is possible, about the two tilting axes $w_1$, $w_2$, in each case about the two tilting directions.

A further configuration of an individual mirror 112 will be described below with the aid of FIGS. 10 to 12. Components, which correspond to those which have already been described above with reference to FIGS. 1 to 2 and, in particular with reference to FIGS. 3 to 9, have the same reference numerals and will not be discussed again in detail.

The reflection face carrier 100 is connected, in the individual mirror 112, to the connecting strip 101, which is simultaneously the joint portion 102.

Arranged on the side of the reflection face carrier 100 opposing the reflection face 80 is a spacer 112a, which at larger tilting angles, ensures that the reflection face carrier 100 does not come into direct contact with components located therebelow. The spacer 112a is worked out of the solid material of the reflection face carrier 100 by deep reactive ion etching (DRIE). The joint portion 102 is connected by a first $w_2$ tilting joint 83 to the $w_2$ joint portion 103, which is simultaneously a first L-shaped intermediate carrier body of the individual mirror 112. The $w_2$ joint portion 103 is connected by a first $w_1$ tilting joint 82 to a first joint portion 107, which is rigidly connected to the plate portion of the carrier body 81. One leg of the L-shape of the $w_2$ joint portion 103 is simultaneously the $w_1$ joint portion 106.

Figure 21:
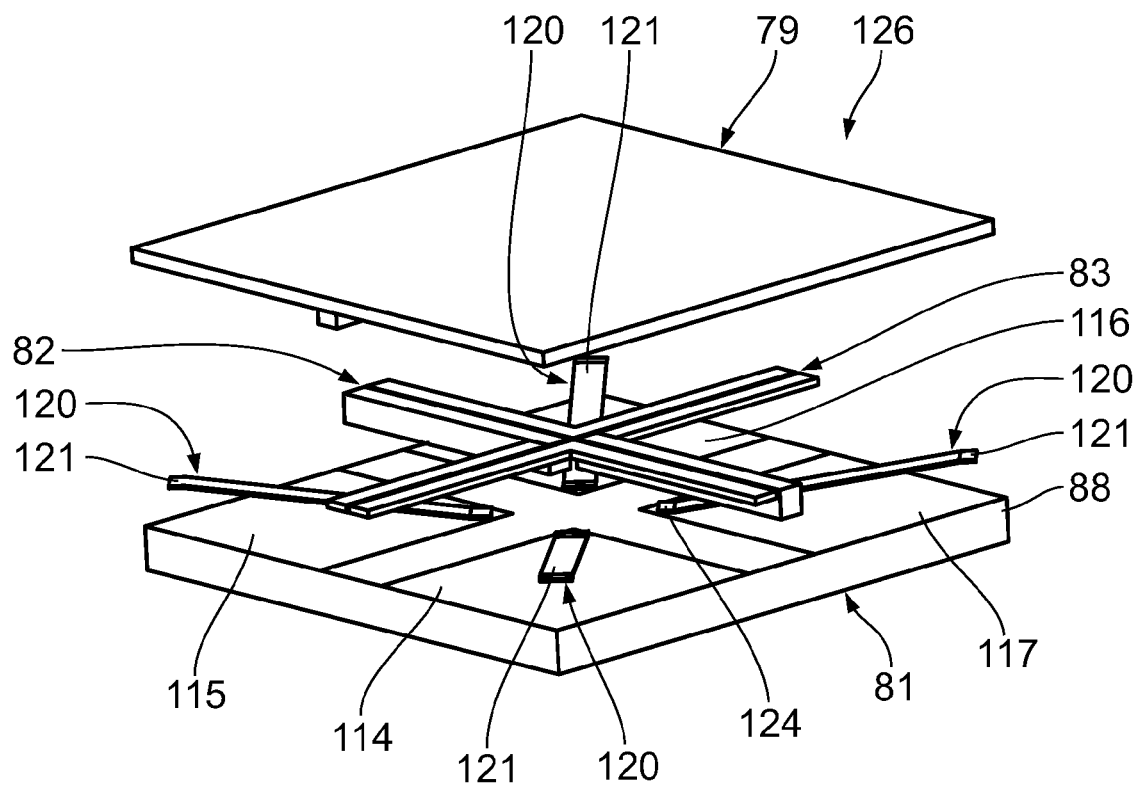
FIG. 21 shows an exploded view of the individual mirror similar to FIG. 10, with the electrode arrangement according to FIG. 20.
Figure 22:
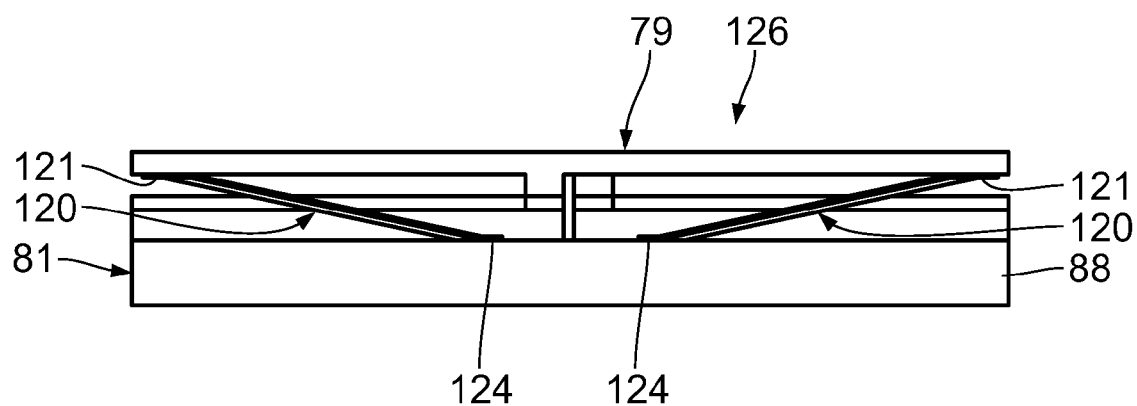
FIG. 22 shows a side view of the individual mirror with the electrode arrangement according to FIG. 20.
Figure 23:
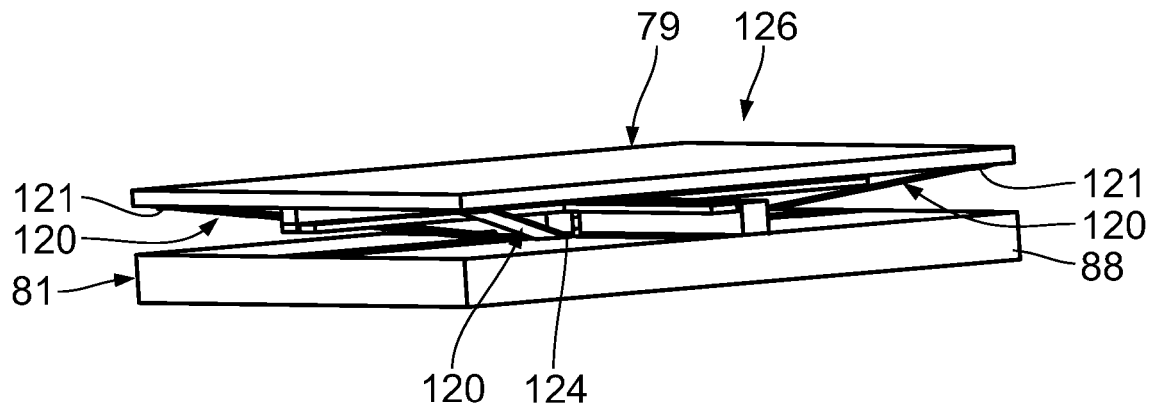
FIG. 23 shows a perspective view of the individual mirror with the electrode arrangement according to FIG. 20.
Figure 25:
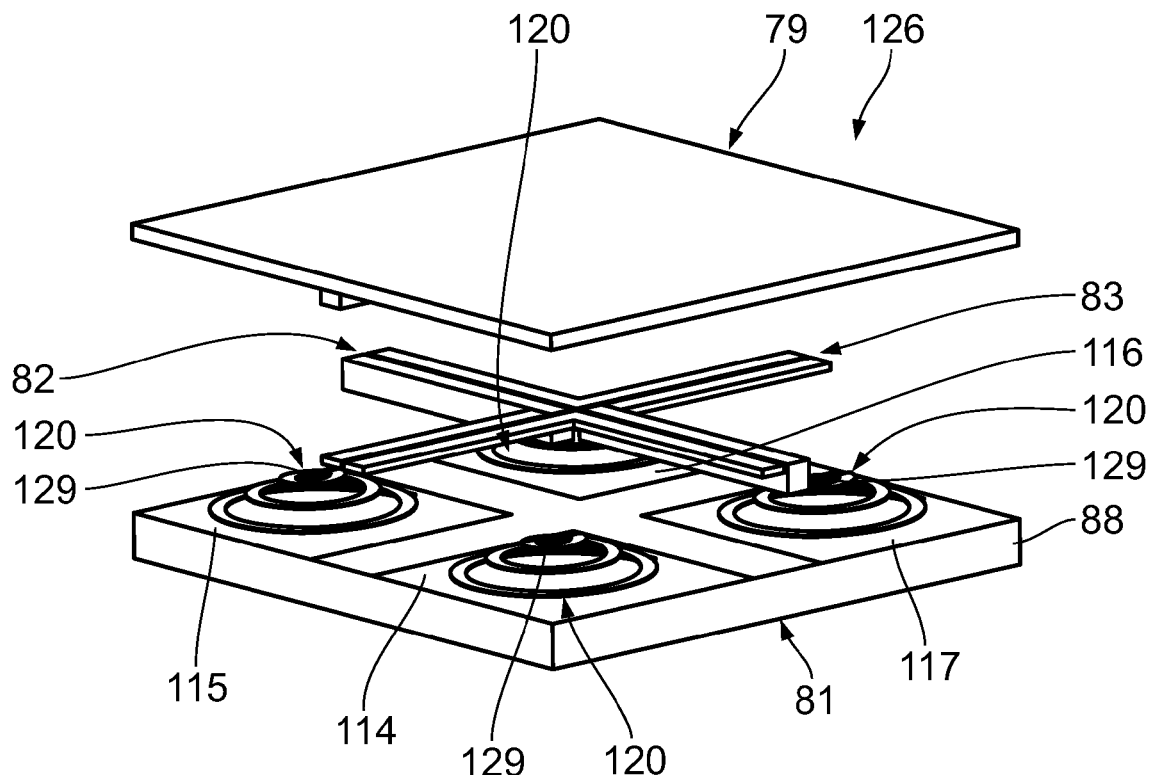
FIG. 25 shows an exploded view similar to FIG. 10, of the individual mirror with the electrode arrangement according to FIG. 24.
Figure 26:
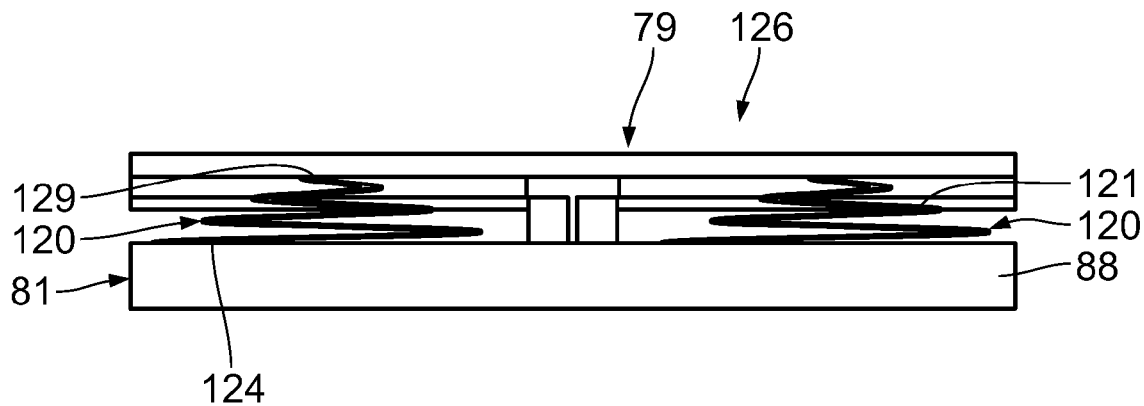
FIG. 26 shows a side view of the individual mirror with the electrode arrangement according to FIG. 24.
Figure 27:
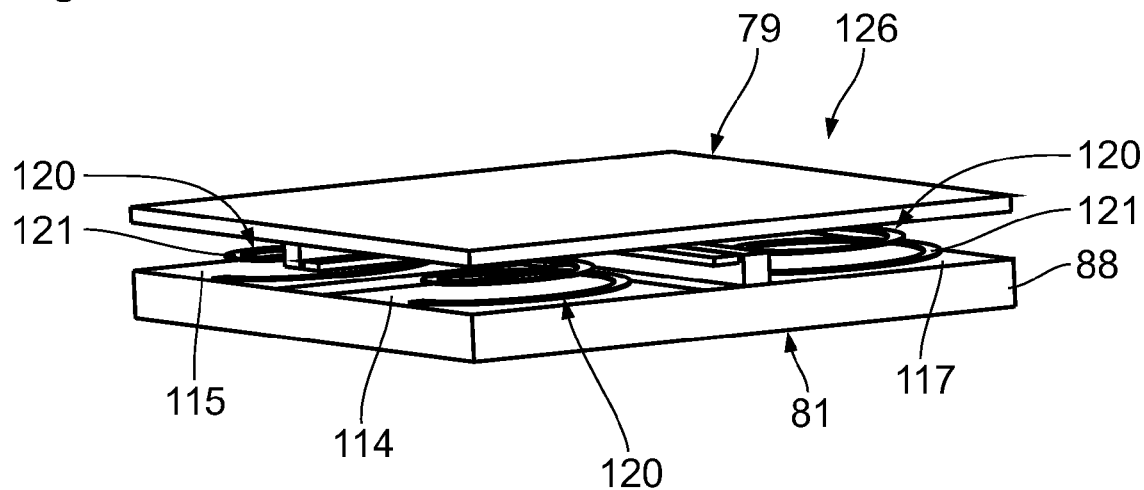
FIG. 27 shows a perspective view of the individual mirror with the electrode arrangement according to FIG. 24.

The individual mirror 112 has a total of two L-shaped assemblies with joint portions 102, 103, 106, 107 and correspondingly with tilting joints 82, 83, which are in each case accommodated in a leg of this L-structural shape. These two L-shaped assemblies in each case have identically configured joint connecting components. In the region of the corner of the respective L-structural shape, which is formed by the mutually adjoining L-legs, these two assemblies are fitted into one another in such a way that, in total, a cross-shaped structure is produced (compare also the structurally identical configuration in this context according to FIG. 21, still to be described), in which the two $w_1$ tilting joints 82 and the two $w_2$ tilting joints 83 are in each case flush with one another.

The spacer 112a is in each case connected to the connecting strips 101 of the two $w_2$ tilting joints 83. As the two connecting strips 101 parallel to the plane of the reflection face 80 and transverse to their longitudinal extent are arranged offset with respect to one another because of the cross structure of the two L-assemblies, the spacer 112 also has spacer portions arranged offset with respect to one another in the same direction.

The mirror body 79 itself is used in each case as an electrode of the $w_1$ actuator, on the one hand, for the controlled tilting of the reflection face 80 about the tilting axis $w_1$ and of the $w_2$ actuator, on the other hand, for the controlled tilting of the reflection face 80 about the tilting axis $w_2$. The individual mirror 112 has four counter-electrodes 114, 115, 116, 117, which in each case cover quadrants of the plate portion 88 of the carrier body 81 and are configured as electrically conductive coatings, which are insulated from one another, on the plate portion 88. Depending on between which of the four counter-electrodes 114 to 117, on the one hand, and the mirror body 79, on the other hand, a tilting voltage V is applied, a corresponding tilting of the reflection face 80 results relative to the carrier body 81. This is shown by way of example in FIG. 11. A voltage V is applied there between the mirror body 79 and the two counter-electrodes 114, 117. A corresponding tilting of the mirror body 79 about the tilting axis $w_1$ of the tilting joint 82 results.

Figure 12:
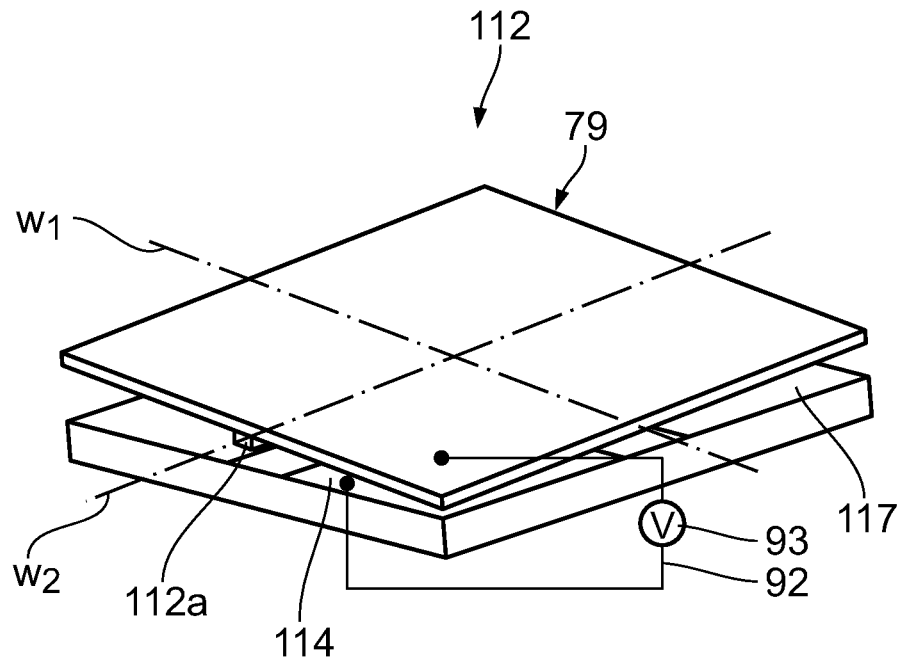
FIG. 12 shows the individual mirror according to FIGS. 10 and 11 in a view similar to FIG. 11, the face being shown tilted relative to the carrier substrate about the two tilting axes.

FIG. 12 shows, in a further tilting example, the situation in which a voltage V is applied exclusively between the mirror body 79 and the counter-electrode 114. A tilting results, on the one hand, about the tilting axis $w_1$ of the tilting joint 82 and, on the other hand, a tilting results about the tilting axis $w_2$ of the tilting joint 83.

Figure 13:
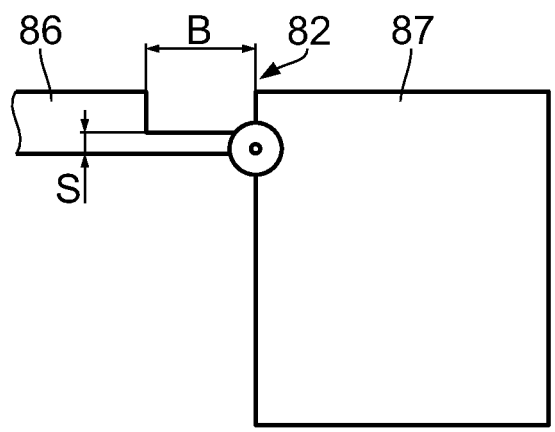
FIG. 13 shows a detail of a tilting joint configured as a solid-body joint, of the individual mirror of one of the configurations according to FIGS. 3 to 12.

In a view alternative to FIG. 5, FIG. 13 shows the dimensional ratios in a further configuration of the tilting joint 82. Also in this case, a joint thickness S is about 1 μm, a joint width B about 20 μm and a joint length L extending perpendicular to the drawing plane of FIG. 13 is about 1 mm.

Figure 14:
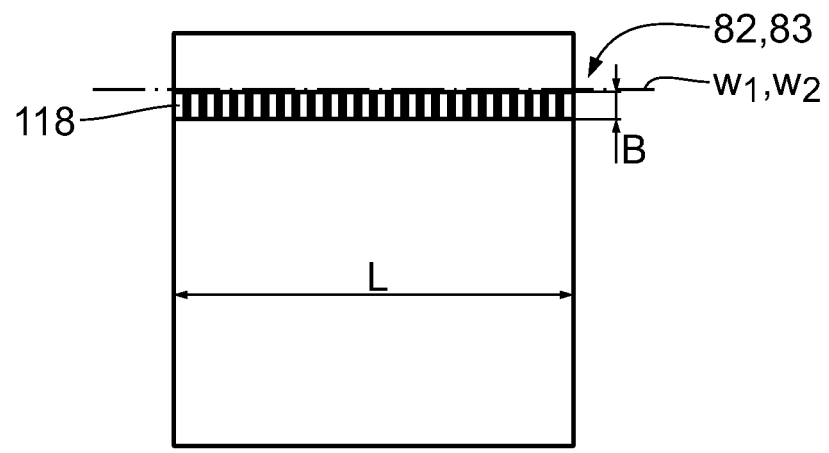
FIG. 14 shows a further configuration of an individual mirror for constructing the facet mirror according to FIG. 2 in a view similar to FIG. 3.

FIG. 14 shows a variant of a tilting joint 82 or 83, in which a segmenting into solid-body joint segments 118 is present along the joint length L. The joint length L in the embodiment according to FIG. 14 is subdivided into about twenty five solid body segments 118 of this type. Adjacent solid-body joint segments 118 have a spacing with respect to one another, even if it is a very small one. The subdivision of the tilting joint 82 or 83 into the solid-body joint segments 118 can take place by deep reactive ion etching (DRIE).

As an alternative to a subdivision into the solid-body joint segments or portions 118, or in addition to this, microchannels may also be provided in the mirror body 79 and/or in the carrier body 81. These microchannels may allow an active cooling of the individual mirror with an, in particular, laminarly through-flowing cooling liquid.

Figure 15:
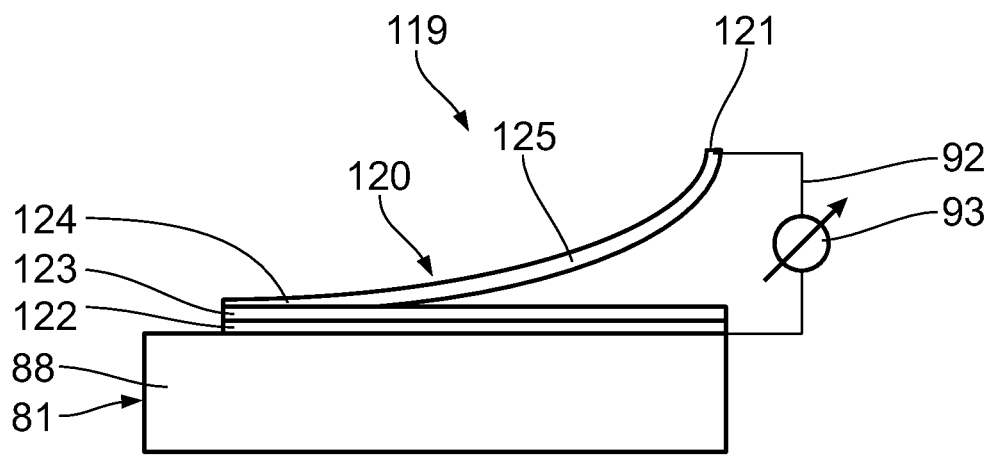
FIG. 15 schematically shows a configuration of an electrostatic capacitive moving wedge actuator for the controlled tilting of a mirror body of the individual mirrors according to FIGS. 3 to 14, no voltage being applied between two electrodes of the actuator.
Figure 16:
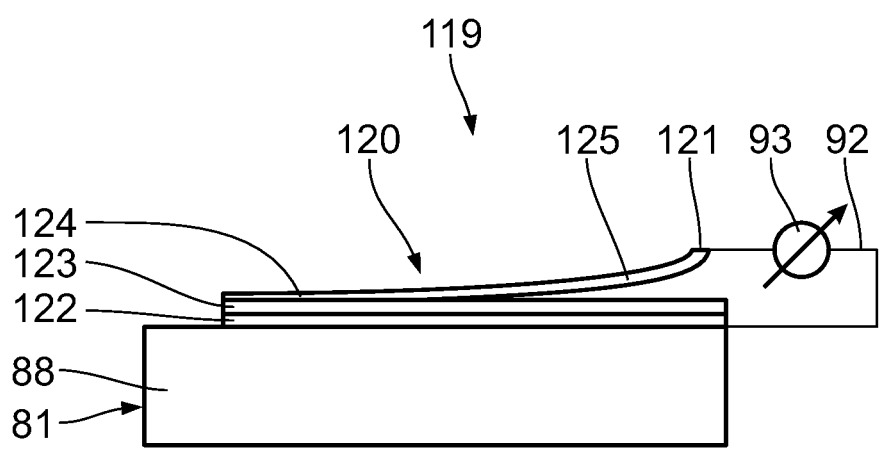
FIG. 16 shows the actuator according to FIG. 15, a voltage being applied between the electrodes thereof.

FIGS. 15 and 16 show a further configuration of an actuator 119 for the controlled tilting of the reflection face 80, for example the individual mirror 21 about the at least one tilting axis $w_1$, $w_2$. Components which correspond to those which have already been described above with reference to FIGS. 3 to 14, have the same reference numerals and will not be described again in detail.

The actuator 119 has a movement electrode 120, the free end 121 of which in FIGS. 15 and 16 is configured for movable connection to a joint body, not shown in FIGS. 15 and 16, of a tilting joint allocated to the actuator 119. The movement electrode 120 is flat and shown in cross section in FIGS. 15 and 16. The movement electrode 120 is curved in the section of FIGS. 15 and 16.

Rigidly connected to the plate portion 88 of the carrier body 81 is a counter-electrode 122 of the actuator 119. The counter-electrode 122 is, for example, configured as a coating on the plate portion 88 of the carrier body 81. Arranged between the movement electrode 120 and the counter-electrode 122 is a layer in the form of a dielectric 123. The dielectric may, for example, be configured as a flat coating on the counter-electrode 122.

In a contact face portion 124, the counter-electrode 122 rests directly on the dielectric 123. A spacing face portion 125 of the movement electrode 120 is spaced apart from the counter-electrode 122 and from the dielectric 123. The free end 121 of the movement electrode 120 is part of the spacing face portion 125.

FIGS. 15 and 16 show two positions of the movement electrode 120. FIG. 15 shows a neutral position in which no voltage is applied between the two electrodes 120, 122. The free end 121 of the movement electrode 120 is then lifted to a maximum extent from the plate portion 88. FIG. 16 shows the position, in which a tilting voltage of, for example, 80 V is applied between the electrodes 120, 122.

In this tilting position according to FIG. 16, the movement electrode 120 additionally rests on the dielectric 123 over a region adjacent to the contact face portion 124, so the spacing of the free end 121 from the plate portion 88 of the carrier body 81 is correspondingly reduced.

Actuators 119 of this type according to FIGS. 15 and 16 are also called micro moving wedge drives (zipper actuators, zipping actuators).

Figure 17:
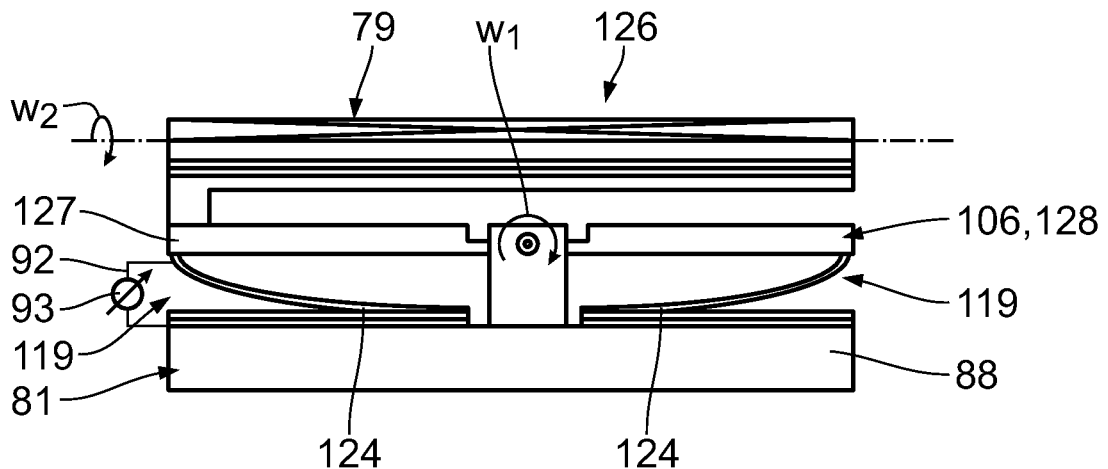
FIG. 17 shows, in a view similar to FIG. 8, a further configuration of an individual mirror for constructing the facet mirror according to FIG. 2, shown in a neutral position, actuators according to FIGS. 15 and 16 being used.
Figure 18:
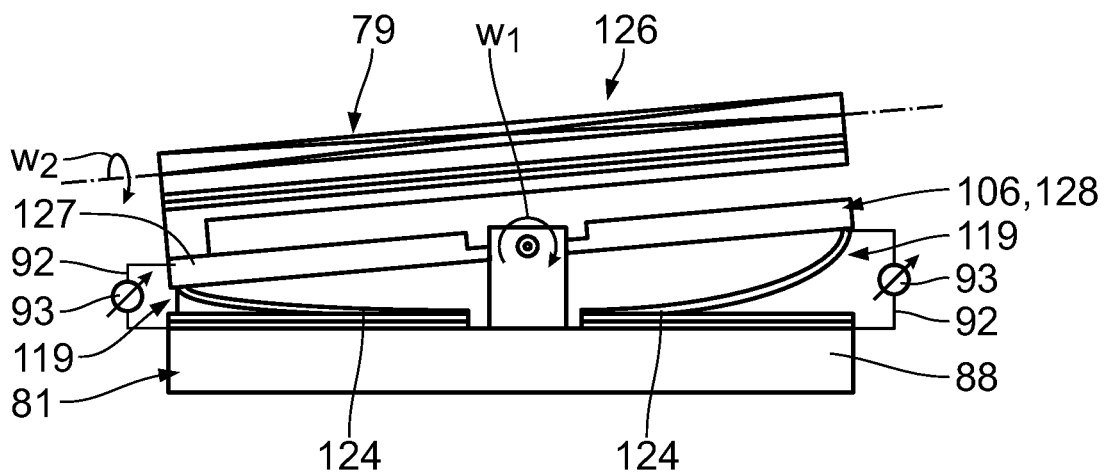
FIG. 18 shows the individual mirror according to FIG. 17, shown in a first tilting position about a first of its two tilting axes.
Figure 19:
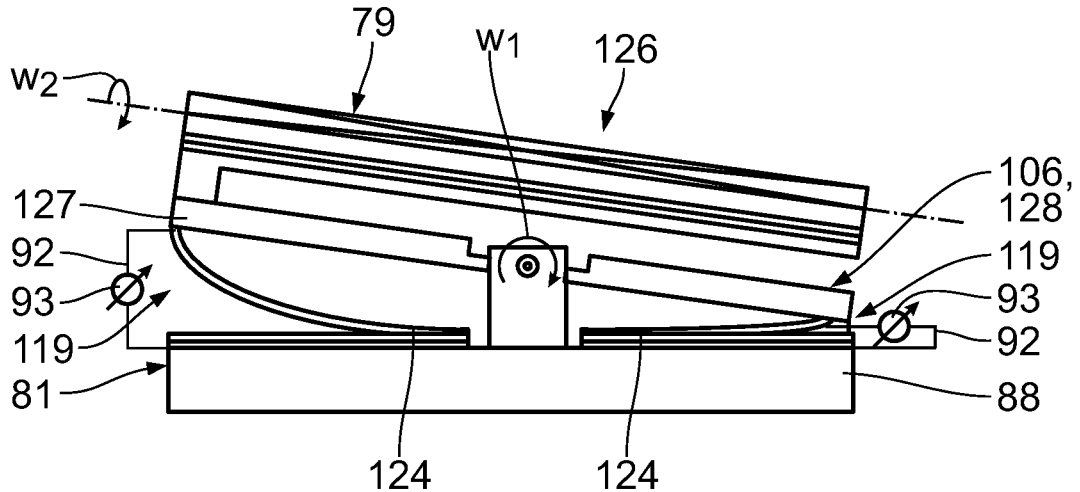
FIG. 19 shows the individual mirror according to FIG. 17, shown in a second tilting position in the opposite direction compared to FIG. 18, tilted about the same tilting axis as in the view according to FIG. 18.
Figure 20:
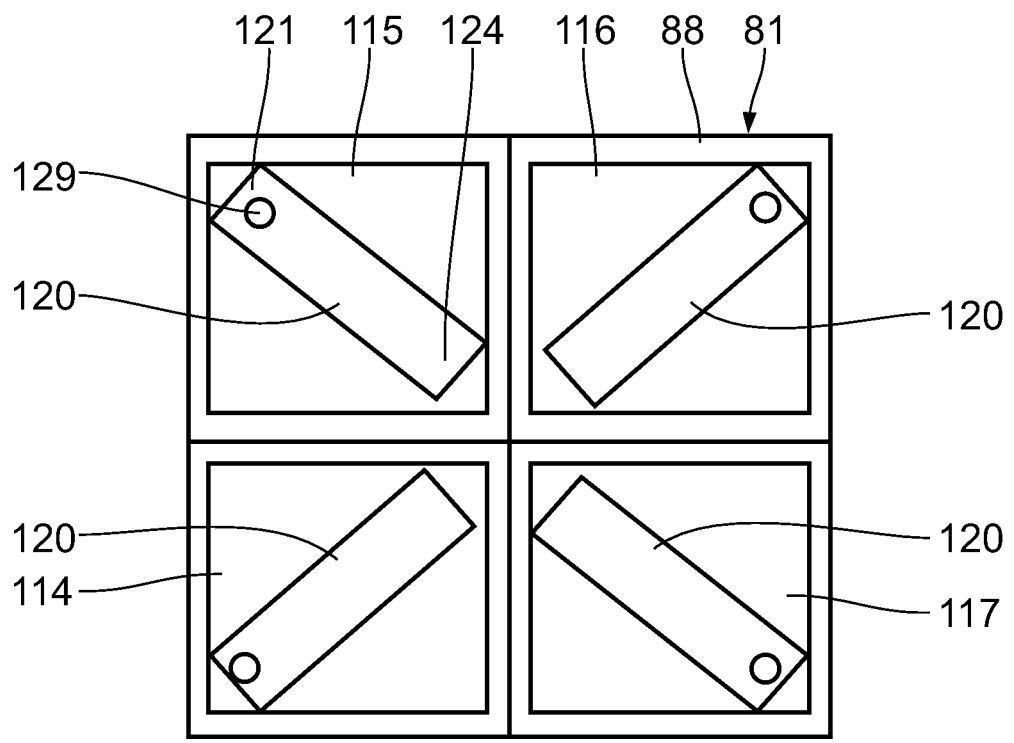
FIG. 20 shows a variant of the electrode arrangement of tilting actuators of the configuration of the individual mirror according to FIG. 17.
Figure 24:
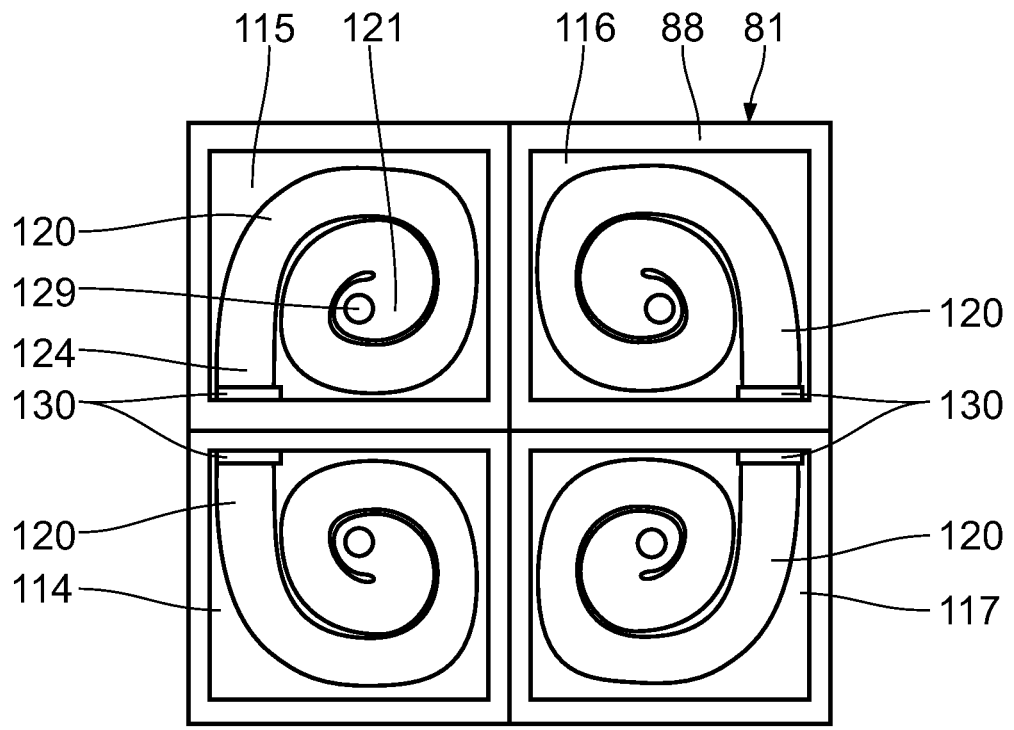
FIG. 24 shows a variant of the electrode arrangement of tilting actuators of the configuration of the individual mirror according to FIG. 17.

FIGS. 17 to 19 show the use of two actuators 119 according to FIGS. 15 and 16 in an individual mirror 126, which, with respect to the arrangement of the tilting joints 82, 83 is configured in accordance with the individual mirror 99 according to FIGS. 8 and 9.

The $w_1$ joint portion 106 is configured, in the individual mirror 126, as a rocker, which is moulded onto the joint portion 107, about the tilting axis $w_1$. At the edge, two rocking arms 127, 128 of the $w_1$ joint portion 106 are connected to the free ends 121 of two actuators 119 arranged back to back with respect to one another in relation to the contact face portions 124.

FIG. 17 shows a neutral position of the two actuators 119, in which the $w_1$ joint portion 106 is present not tilted relative to the plate portion 88 of the carrier body 81. This neutral position according to FIG. 17 can be achieved in a first variant of the individual mirror 126 in that all the electrodes 120, 121 are switched to be voltage-free.

An alternative voltage activation device, not shown in the drawing, for the actuator 119 is configured in such a way that, in a neutral position of the $w_1$ joint portion 106, in other words of the rocking arms 127, 128 (cf. FIG. 17) a bias voltage which is different from 0 V is applied between the movement electrodes 120 and the associated counter-electrodes 122. An electrical bias voltage of this type is used to produce a mechanical bias voltage of the rocking arms 127, 128 about the tilting axis $w_1$. In this manner, the neutral position, in which the mirror body 79 is oriented precisely parallel to the carrier body 81, can be adjusted in a defined manner.

FIG. 18 shows the situation, in which a tilting voltage is applied to the electrodes 120, 122 of the actuator 119 shown on the left in FIG. 18. Accordingly, the mirror body 79 is tiled about the tilting axis $w_1$ in the anti-clockwise direction.

FIG. 19 shows the situation in which a tilting voltage is applied to the actuator 119 shown on the right in FIG. 19. Accordingly, the mirror body 79 is tilted about the tilting axis $w_1$ in the clockwise direction FIG. 19.

FIGS. 20 to 23, on the one hand, and FIGS. 24 to 27, on the other hand, show two different configuration and arrangement variants of the movement electrodes 120. Components, which correspond to those, which have already been described above with reference to FIGS. 1 to 19, have the same reference numerals and will not be discussed again in detail.

Figure 10:
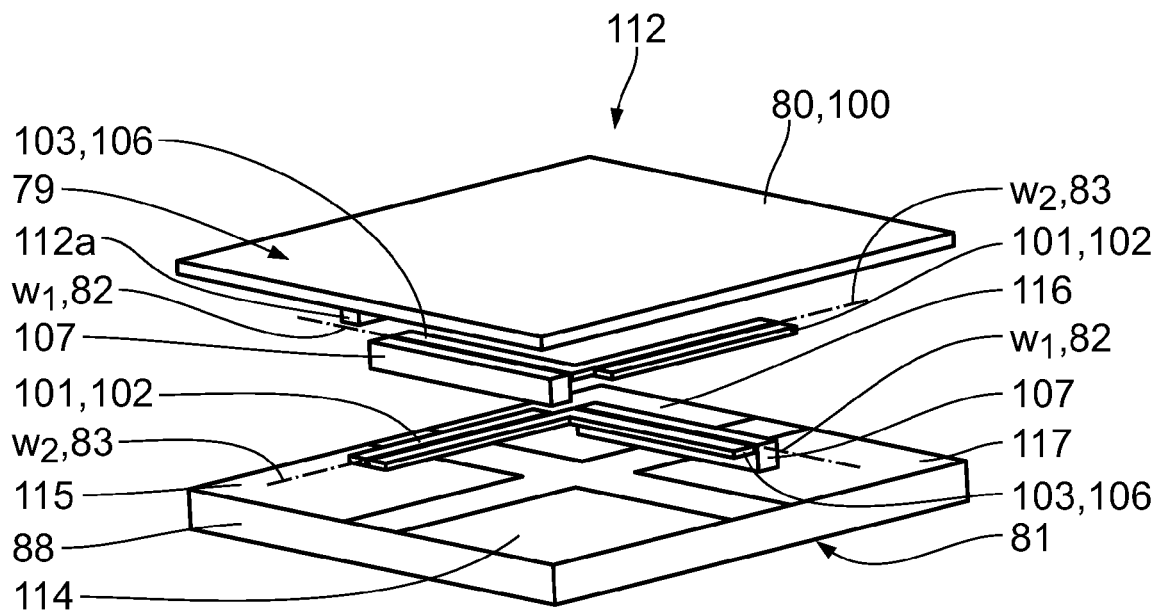
FIG. 10 shows an exploded view of a further configuration of an individual mirror to construct the facet mirror according to FIG. 2.
Figure 11:
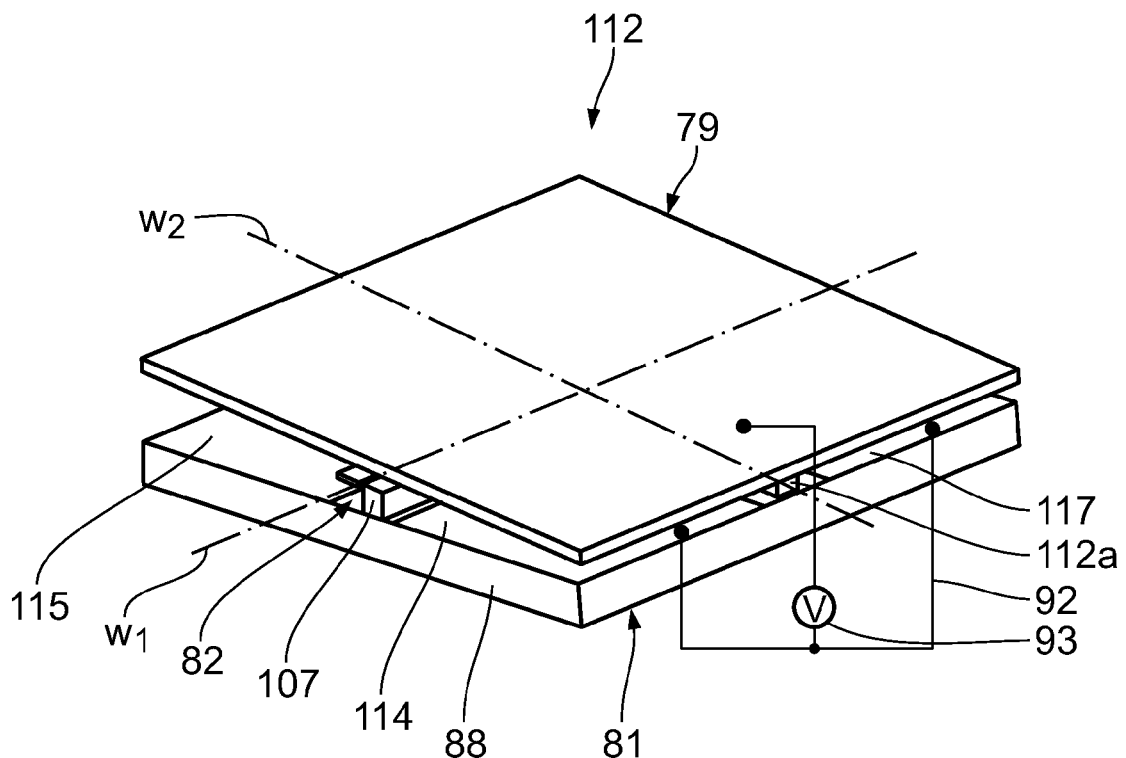
FIG. 11 shows a perspective view of the configuration of the individual mirror according to FIG. 10 in a tilting position, in which a mirror plate is tilted relative to a carrier substrate about one of two tilting axes which can be activated by an actuator.

The counter-electrodes to the movement electrodes 120 of the arrangements according to FIGS. 20 to 27 are designed as quadrant electrodes 114 to 117 in accordance with the configuration according to FIGS. 10 to 12.

In the actuator 119 according to FIGS. 20 to 23, four movement electrodes 120 arranged radially in each case on the plate portion 88 of the carrier body 81 in one of the quadrants of the plate portion 88 are present. The free ends 121 of the movement electrodes 120 according to FIGS. 20 to 23 are in each case arranged close to the four corners of the square plate portion 88 of the carrier body 81. These free ends 121 carry contact portions 129, by which the movement electrodes 120 are movably connected to the intermediate carrier body or the mirror body 79. The contact portion 129 is a connecting region of the movement electrode 120, for example, to the w1 joint portion 106, in other words to a joint body. Opposite the free end 121, each of the movement electrodes 120 in the configuration according to FIG. 20 to 27 has an end rigidly connected to the plate portion 88 in the region of the contact face portion 124.

In the configuration and arrangement example of the movement electrodes 120 according to FIGS. 24 to 27, each of the movement electrodes is present as a spiral face body. Between a fixed end 130 of the movement electrode 120 according to FIGS. 24 to 27, on which the latter is fixed to the plate portion 88, and the contact portion 129 at the free end 121, each of the movement electrodes 120 runs through about three spiral windings.

According to the arrangement according to FIGS. 20 to 23, four movement electrodes 120 are also arranged in the arrangement according to FIGS. 24 to 27, one of the four movement electrodes 120 in each case being arranged in one of the four quadrants of the plate portion 88.

The fixed ends 130 of each movement electrode 120, in the arrangement according to FIGS. 24 to 27, are located close to a corner of the respective quadrant of the plate portion 88. The contact portions 129, in the arrangement according to FIGS. 24 to 27, are located in the region of the centre of the respective quadrants of the plate portion 88.

The actuator 119, instead of an electrostatic drive, can also have an electromagnetic drive. In this case, instead of the counter-electrode 122 and the dielectric 123, an electromagnetic reluctance actuator is provided. Instead of the movement electrode 120, a thin, ferromagnetic metal plate is provided.

A further configuration of an actuator 131 for the controlled tilting of the mirror body 79 about a tilting axis is described below with the aid of FIGS. 28 to 30. Components, which correspond to those, which have already been described above with reference to FIGS. 1 to 27 and, in particular, with reference to FIGS. 3 to 27, have the same reference numerals and will not be discussed again in detail.

Figure 28:
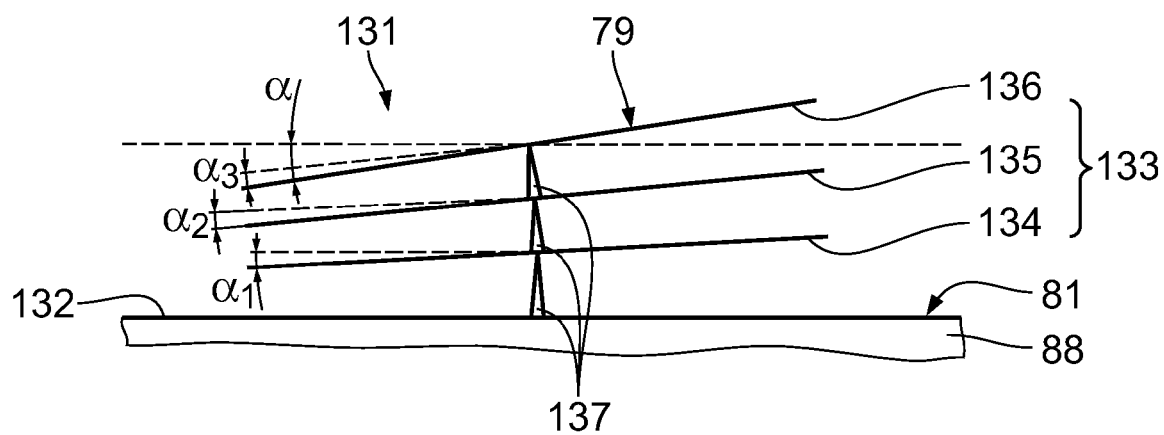
FIG. 28 schematically shows, in a view similar to FIG. 18, a further configuration of an individual mirror for constructing the facet mirror according to FIG. 2 with a further configuration of a tilting actuator with an electrode stack.
Figure 29:
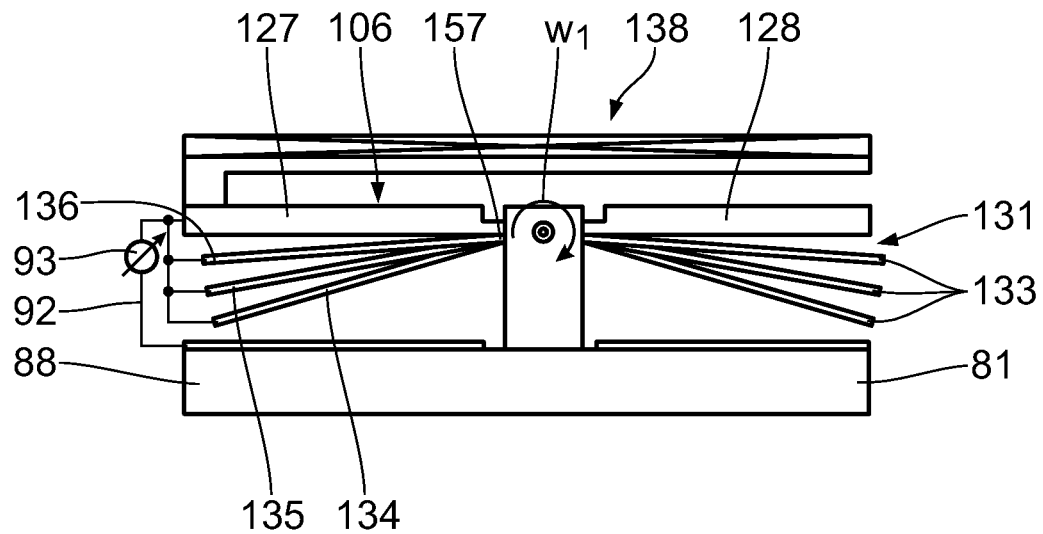
FIG. 29 shows, in a view similar to FIG. 17, a further configuration of an individual mirror for constructing the facet mirror according to FIG. 2 with a configuration of tilting actuators corresponding to FIG. 28.
Figure 30:
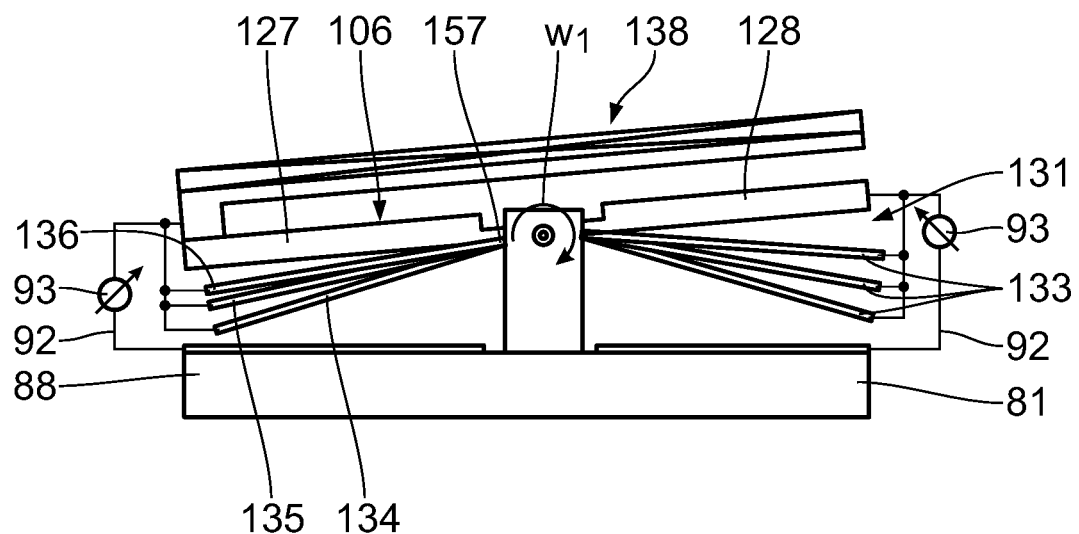
FIG. 30 shows a view similar to FIG. 18 of the individual mirror according to FIG. 29.
Figure 31:
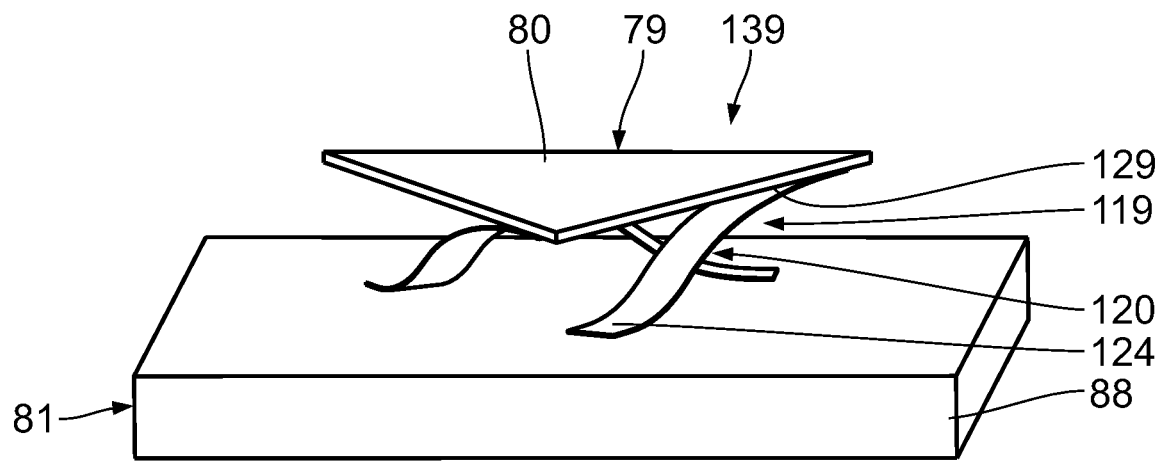
FIG. 31 perspectively shows a further configuration of an individual mirror which can be tilted by an actuator.
Figure 32:
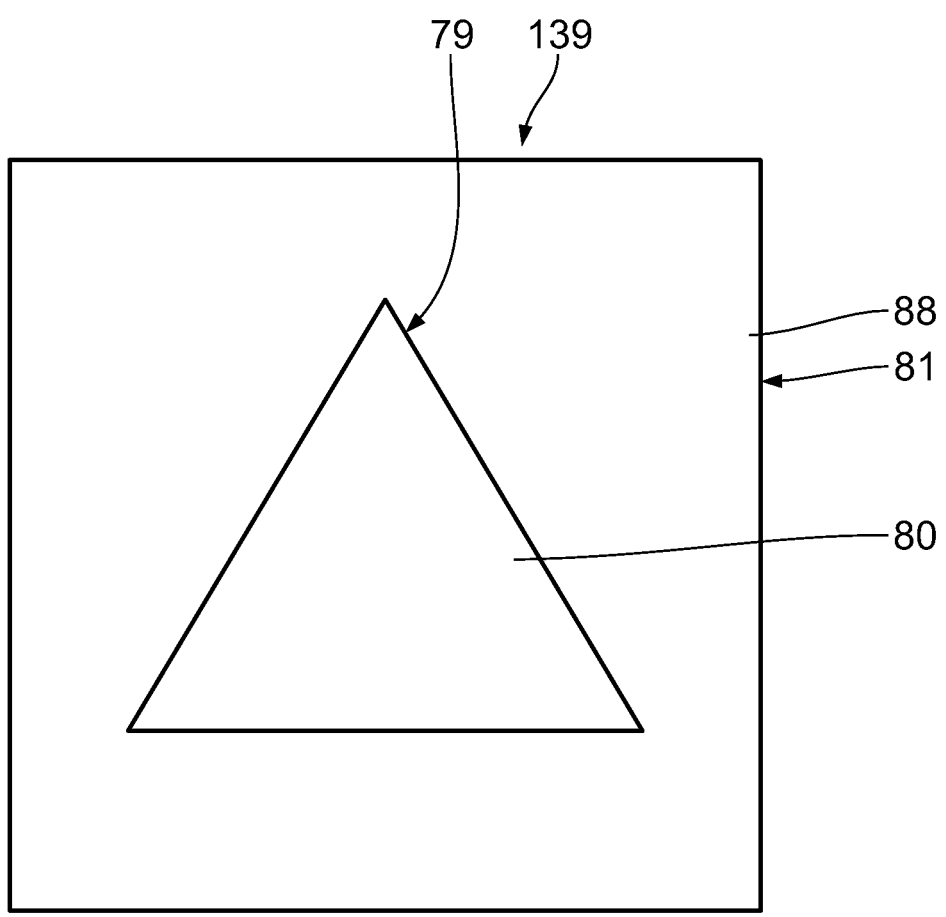
FIG. 32 shows a plan view of the individual mirror according to FIG. 31.
Figure 33:
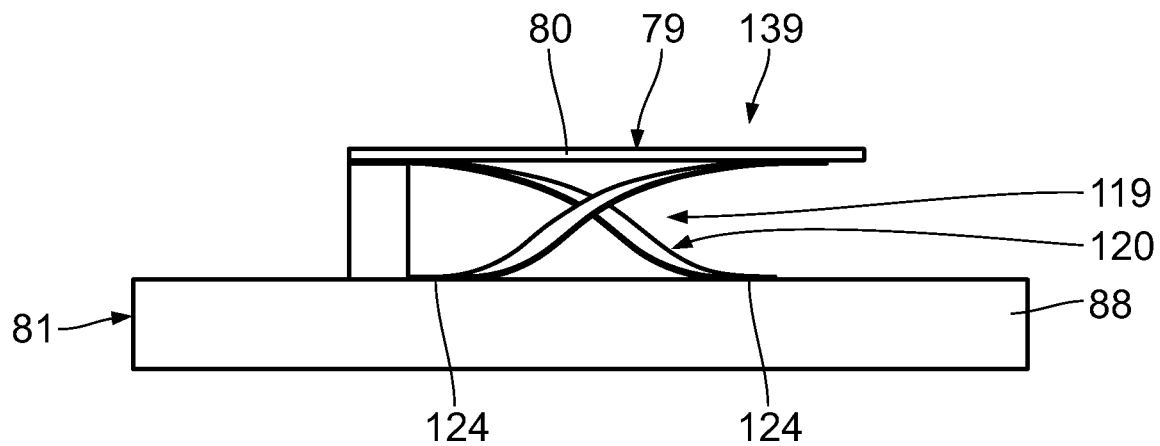
FIG. 33 shows a side view of the individual mirror according to FIG. 31.
Figure 34:
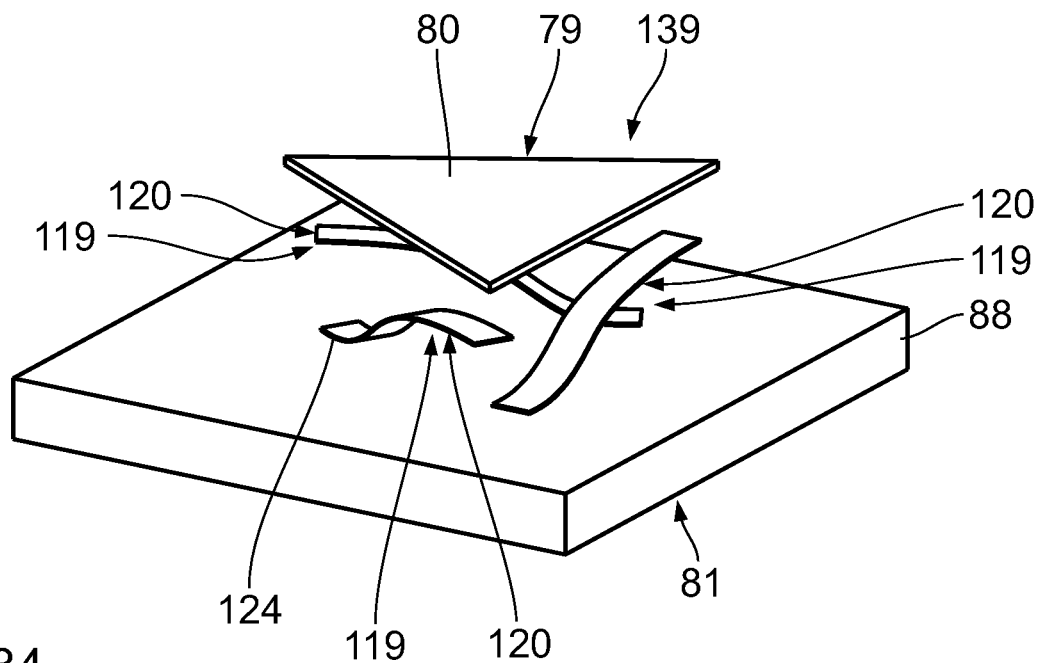
FIG. 34 shows an exploded view of the individual mirror according to FIG. 31.

In the actuator 131 according to FIGS. 28 to 30, an electrically conductive coating 132 on the plate portion 88 of the carrier body 81 is in turn used as one of the electrodes of the actuator 131. A stack 133 of counter-electrodes 134, 135, 136 is arranged above this electrode 132. Adjacent counter-electrodes can be tilted with respect to one another about a solid-body joint 137, in each case, shown schematically in FIG. 28. Each of the solid-body joints 137 extends accordingly to the above-described tilting joints 82, 83 along the joint width of a reflection face on the mirror body 79. The counter-electrodes 134 to 136 are already present in a force-free neutral position inclined with respect to the plane of the electrode 132 on the plate portion 88, as shown by dashed lines in FIG. 28, in each case. FIG. 28 shows in solid lines the situation in which an additional tilting voltage is applied between adjacent electrodes 132 and 134 to 136. This leads to adjacent electrodes 132 and 134 to 136, proceeding from the neutral inclined position, being further inclined toward one another by deflection about the solid-body joints 137. The counter-electrode 136 shown uppermost in FIG. 28 therefore experiences an angle of inclination which corresponds to the sum of the relative inclines of the electrode pairs arranged therebelow with respect to one another. The mirror body 79 may in turn be connected to the counter-electrode 136 shown uppermost in FIG. 28 and is then correspondingly tilted by an actuator. A total tilting angle of the uppermost counter-electrode 136, a, is produced as the sum of the individual tilting angles $\alpha_1$, $\alpha_2$, $\alpha_3$ of the counter-electrodes 134, 135 and 136.

An application of the actuator 131 in an individual mirror 138 in the manner of the individual mirror 126 of FIGS. 17 to 19 will be described with the aid of FIGS. 29 and 30. The actuators 131 with the counter-electrode stacks 133 are in this case arranged between the plate portion 88 of the carrier body 81 and the rocking arms 127, 128 of the $w_1$ joint portion 106 of the intermediate carrier body 104. In contrast to the configuration according to FIG. 28, in the actuators 131 of the configuration according to FIGS. 29 and 30, the solid-body joints 157 are arranged adjacent to the tilting axis $w_1$.

FIG. 29 shows the neutral position. FIG. 30 shows the position in which a tilting voltage is applied to the electrodes 132 and 134, 135, 136 of the actuator 131 shown on the left in FIG. 30. The result is a tilting of the $w_1$ joint portion 106 in FIG. 30 about the tilting axis $w_1$ in the anti-clockwise direction.

In other variants of tilting joints, another dimension ratio of the joint length L to the joint thickness S may also be present. L/S may be greater than 50, greater than 100, greater than 250 or else greater than 500. A ratio of L/S of greater than 1000 is also possible.

A further configuration of an individual mirror 139 with actuators in the manner of the actuators 119 for the controlled tilting of the mirror body 79 will be described below with the aid of FIGS. 31 to 34. Components which correspond to those which have already been described above with reference to FIGS. 1 to 30 and, in particular with reference to FIGS. 3 to 30, have the same reference numerals and will not be described again in detail.

The mirror body 79 and also the reflection face 80, in the individual mirror 139, have the shape of an equilateral triangle. The side length of one of the three sides may be about 1 mm. One of the respective actuators 119 is arranged parallel to one of the three sides of this triangle, in each case.

Each of the actuators 119 has a movement electrode 120, which is connected by a contact portion 129 to the mirror body 79 and by a contact face portion 124 to the carrier body 81. An actuation of the three actuators 119 can take place independently of one another in accordance with that which was described above in conjunction with the description of the actuator 119 according to FIGS. 15 to 27. In this manner, a tilting of the reflection face 80 relative to the carrier body 81 by three independent tilting degrees of freedom is possible.

The arrangement of the three actuators 119 is such that the contact portions 129 are in each case arranged above the contact face portion 124 of the adjacent actuator 119 in a plan view of the individual mirror 139 in an anti-clockwise direction.

The individual mirror 139 has no joints in the manner of the tilting joints 82, 83.

The actuators described above for tilting the mirror body 79 may have an integrated sensor system for measuring the respective tilting angle about the tilting axes $w_1$, $w_2$. This sensor system may be used, in particular, for monitoring the adjusted tilting angle.

A sensor system of this type may, for example, be formed by a capacitive measuring bridge, in particular in the form of a Wien bridge. As a result, it is possible to determine a capacitance between the reflection face of the mirror body 79, on the one hand, and a reference body, on the other hand, depending on the distance of these two bodies from one another, in other words depending on a tilting angle position of the reflection face of the mirror body 79. In this case, a direct voltage, which is used for the above-described actuator system of the mirror body 79, can be superimposed by an alternating voltage fraction, which is applied between the above-described electrodes. An impedance change of the looked for capacitance can then be measured by the integrated measuring bridge. For this purpose, a zero balance is made, in which a known variable capacitance or a known variable resistance is used within the bridge circuit. The measuring bridge itself may be embedded in an integrated circuit, which is located directly below the carrier body 81 or even within the latter. This ensures that parasitic capacitances due to short signal line distances are minimised. A signal amplification and an analogue/digital conversion of the sensor system and an actuator activation can take place in an also integrated ASIC (Application Specific Integrated Circuit).

With the aid of the projection exposure system 1, at least a part of the reticle is imaged in the object field 5 on a region of a light-sensitive layer on the wafer in the image field 8 to lithographically produce a microstructured or nanostructured component, in particular a semiconductor component, for example a microchip. Depending on the configuration of the projection exposure system 1 as a scanner or as a stepper, the reticle and the wafer are moved in a time-synchronised manner in the y-direction, continuously in scanner operation or stepwise in stepper operation.

What is claimed is:

1. A system, comprising:
   a mirror configured to be used in a microlithography facet mirror, the mirror comprising:
      a rigid carrier body; and
      a mirror body configured to be tiltable relative to the rigid carrier body about a tilting axis; and
   an actuator configured to control tilting of the mirror body about the tilting axis, the actuator comprising:
      a first joint body;
      a second joint body;
      a movement electrode movably connected to the first joint body;
      a counter-electrode rigidly connected to the second joint body; and
      a dielectric between the movement electrode and the counter-electrode,
   wherein:
      in a contact face portion, the movement electrode contacts the dielectric layer;
      in a spacing face portion, a continuously increasing space is present between the movement electrode and the counter-electrode in a force-free state;
      when the mirror body is tilted in a first position about the tilting axis, the contact face portion has a first area which is a total area of contact between the movement electrode and the dielectric layer;
      when the mirror body is tilted in a second position about the tilting axis, the contact face portion has a second area which is a total area of contact between the movement electrode and the dielectric layer;
      the first position is different from the second position;
      the first area is different from the second area; and
      the movement electrode is connected to the first joint body in the spacing face portion.

2. The system of claim 1, comprising at least three actuators, wherein each actuator has a movement electrode.

3. The system of claim 1, wherein the movement electrode is curved.

4. The system of claim 1, wherein the movement electrode has a rectangular base face.

5. The system of claim 1, wherein the movement electrode has a spiral base face.

6. The system of claim 1, comprising a voltage input device configured to apply a bias voltage to the movement electrode and the counter-electrode when the actuator is in a neutral position between the movement electrode and the counter-electrode.

7. The system of claim 1, wherein the mirror body has a reflection face with a size of at least 1 mm×1 mm.

8. The system of claim 1, wherein the mirror body has a reflection face, and the tilting axis extends in a plane of the reflection face or parallel thereto.

9. The system of claim 1, wherein the actuator comprises at least two electrodes arranged separately from one another on the rigid carrier body.

10. The system of claim 1, wherein the actuator comprises four electrodes arranged separately from one another on the rigid carrier body.

11. The system of claim 10, wherein the four electrodes are arranged quadrant-wise.

12. A facet mirror, comprising a plurality of systems according to claim 1, wherein the facet mirror is an EUV lithography facet mirror.

13. The facet mirror of claim 12, wherein each mirror provides a mirror illumination channel configured to guide illumination radiation to an object field, and each mirror has a mirror face configured so that each mirror illumination channel illuminates a portion of the object field which is smaller than the object field.

14. An illumination system, comprising:
   a first facet mirror comprising a plurality of systems according to claim 1,
   wherein the illumination optical system is a microlithography illumination optical system.

15. A projection exposure system, comprising:
   an illumination system, comprising a facet mirror comprising a plurality of systems according to claim 1; and
   a projection optical system,
   wherein the projection exposure system is a microlithography projection exposure system.

16. The projection exposure system of claim 15, further comprising an EUV radiation source.

17. A method, comprising:
   a) providing a microlithography projection exposure system, comprising:
      an illumination system, comprising a facet mirror comprising a plurality of systems according to claim 1; and
      a projection optical system
   b) using the microlithography projection exposure system to project at least a portion of a reticle onto a region of a light-sensitive layer.

18. A system, comprising:
   a mirror configured to be used in a microlithography facet mirror, the mirror comprising:
      a rigid carrier body;
      a tilting joint; and
      a mirror body configured to be tiltable relative to the rigid carrier body about a tilting axis of the tilting joint,
   wherein:
      the tilting joint is a solid-body joint;
      the solid-body joint has a thickness perpendicular to the tilting axis;
      the solid-body joint has a length along the tilting axis; and
      a ratio of the length to the thickness is greater than 50; and
   an actuator configured to control tilting of the mirror body about the tilting axis, the actuator comprising:
      a movement electrode movably connected to a first joint body of the tilting joint;
      a counter-electrode rigidly connected to a second joint body of the tilting joint; and
      a dielectric between the movement electrode and the counter-electrode,
   wherein:
      in a contact face portion, the movement electrode contacts the dielectric layer;
      in a spacing face portion, a continuously increasing space is present between the movement electrode and the counter-electrode in a force-free state;
      the movement electrode is connected to the first joint body in the spacing face portion;
      when the mirror body is tilted in a first position about the tilting axis, the contact face portion has a first area which is a total area of contact between the movement electrode and the dielectric layer;
      when the mirror body is tilted in a second position about the tilting axis, the contact face portion has a second area which is a total area of contact between the movement electrode and the dielectric layer;

the first position is different from the second position; and the first area is different from the second area.

19. The system of claim 18, wherein the mirror body is tiltable relative to the carrier body about two tilting axes of two tilting joints, and the two tilting axes are not parallel to each other.

20. The system of claim 19, wherein a first of the two tilting joints is arranged between the mirror body and an intermediate body, and a second of the two tilting joints is between the intermediate body and the carrier body.

21. The system of claim 19, wherein:
the two tilting joints are solid-body joints;
for each of the two solid-body joints, the solid body joint has a thickness perpendicular to its tilting axis;
for each of the two solid-body joints, the solid body joint has a length along its tilting axis; and
for each of the two solid-body joints, a ratio of the length to the thickness is greater than 50.

22. The system of claim 18, wherein the tilting joint is divided into a plurality of separate solid-body joint portions along the tilting axis.

23. The system of claim 18, wherein the tilting joint is to the side of a reflection face of the mirror body.

24. The system of claim 18, wherein the mirror body has a reflection face, and the tilting joint is centrally below the reflection face.

* * * * *

UNITED STATES PATENT AND TRADEMARK OFFICE
CERTIFICATE OF CORRECTION

| | | |
|---|---|---|
| PATENT NO. | : 9,013,676 B2 | Page 1 of 1 |
| APPLICATION NO. | : 13/172448 | |
| DATED | : April 21, 2015 | |
| INVENTOR(S) | : Armin Werber, Norbert Muehlberger and Florian Bach | |

It is certified that error appears in the above-identified patent and that said Letters Patent is hereby corrected as shown below:

On the Title Page

Page 2, Column 2, Item (56) References Cited, Other Publications, Line 9, delete "al" insert --al.--;

Page 2, Column 2, Item (56) References Cited, Other Publications, Line 10, delete "elastrostatic" insert --electrostatic--;

In the Specification

Column 1, Line 2, delete "FACETED" insert --FACET--;

Column 1, Line 15, delete "Jan. 9, 2002" insert --Jan. 9, 2009--;

Column 1, Line 52, delete "elastrostatic" insert --electrostatic--;

Column 2, Line 52, delete "an";

Column 2, Line 65, delete "An, in" insert --In--;

Column 12, Line 65, delete "solid body" insert --solid-body--;

Column 13, Line 7, delete "an";

Column 14, Line 46, delete "FIG." insert --FIGS.--;

In the Claims

Column 19, Line 14, Claim 21, delete "solid body" insert --solid-body--; and

Column 19, Line 16, Claim 21, delete "solid body" insert --solid-body--.

Signed and Sealed this
Twenty-second Day of September, 2015

Michelle K. Lee
*Director of the United States Patent and Trademark Office*